(12) United States Patent
Yokota et al.

(10) Patent No.: US 7,029,825 B2
(45) Date of Patent: Apr. 18, 2006

(54) PHOTOSENSITIVE RESIN COMPOSITIVE FOR PRINTING PLATE PRECURSOR CAPABLE OF LASER ENGRAVING

(75) Inventors: Masahisa Yokota, Hachiouji (JP); Kei Tomeba, Fuji (JP); Hiroshi Yamada, Fuji (JP); Yoshifumi Araki, Fuji (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 0 days.

(21) Appl. No.: 10/479,607

(22) PCT Filed: Aug. 30, 2002

(86) PCT No.: PCT/JP02/08811

§ 371 (c)(1),
(2), (4) Date: Dec. 4, 2003

(87) PCT Pub. No.: WO03/022594

PCT Pub. Date: Mar. 20, 2003

(65) Prior Publication Data

US 2004/0157162 A1     Aug. 12, 2004

(30) Foreign Application Priority Data

Sep. 5, 2001  (JP) ............................. 2001-268892
Mar. 15, 2002  (JP) ............................. 2002-072002
Jun. 13, 2002  (JP) ............................. 2002-173022

(51) Int. Cl.
G03C 1/735      (2006.01)
G03F 7/00       (2006.01)

(52) U.S. Cl. ................ 430/281.1; 430/270.1; 430/306; 430/945

(58) Field of Classification Search ............... 430/306, 430/300, 310
See application file for complete search history.

(56) References Cited

U.S. PATENT DOCUMENTS 3,549,733 A    12/1970  Caddell
4,530,747 A *  7/1985  Donges et al. ............... 522/87
5,259,311 A    11/1993  McCaughey, Jr.
5,798,202 A    8/1998   Cushner et al.
5,804,353 A    9/1998   Cushner et al.
6,143,386 A    11/2000  Lorig et al.
6,399,270 B1 * 6/2002   Mori et al. ............... 430/270.1
6,511,784 B1   1/2003   Hiller et al.
6,627,385 B1   9/2003   Hiller et al.
6,737,216 B1   5/2004   Kannurpatti et al.
2001/0044076 A1 11/2001 Hiller et al.

FOREIGN PATENT DOCUMENTS

| DE | DE 19918363 A1 | 10/2000 |
| EP | EP 0450199 A1  | 9/1991  |
| JP | JP 47-5121     | 2/1972  |
| JP | JP 56-64823 A  | 6/1981  |
| JP | JP 10-193821 A | 7/1998  |
| JP | JP 2846954 B2  | 10/1998 |
| JP | JP 2846955 B2  | 10/1998 |
| JP | JP 10-512823 A | 12/1998 |
| JP | JP 2000-225780 A | 8/2000 |
| JP | JP 2000-318315 A | 11/2000 |
| JP | JP 2001-121833 A | 5/2001 |
| JP | JP 2001-328365 A | 11/2001 |
| JP | JP 2002-3665 A | 1/2002 |

* cited by examiner

Primary Examiner—Rosemary Ashton
(74) Attorney, Agent, or Firm—Birch, Stewart, Kolasch & Birch, LLP

(57) ABSTRACT

Disclosed is a photosensitive resin composition for forming a laser engravable printing element, comprising: (a) 100 parts by weight of a resin which is a plastomer at 20° C., wherein the resin has a number average molecular weight (Mn) of from 1,000 to 100,000 and has a polymerizable unsaturated group in an amount such that the average number of the polymerizable unsaturated group per molecule is at least 0.7, (b) 5 to 200 parts by weight, relative to 100 parts by weight of resin (a), of an organic compound having an Mn of less than 1,000 and having at least one polymerizable unsaturated group per molecule, and (c) 1 to 100 parts by weight, relative to 100 parts by weight of resin (a), of an inorganic porous material. Also disclosed is a laser engravable printing element formed from the above-mentioned resin composition.

12 Claims, No Drawings

PHOTOSENSITIVE RESIN COMPOSITIVE FOR PRINTING PLATE PRECURSOR CAPABLE OF LASER ENGRAVING

BACKGROUND OF THE INVENTION

1. Field of the Invention

The present invention relates to a photosensitive resin composition for forming a laser engravable printing element. More particularly, the present invention is concerned with a photosensitive resin composition for forming a laser engravable printing element, comprising: (a) a resin which is a plastomer at 20° C., wherein the resin has a number average molecular weight of from 1,000 to 100,000 and has a polymerizable unsaturated group in an amount such that the average number of the polymerizable unsaturated group per molecule is at least 0.7, (b) an organic compound having a number average molecular weight of less than 1,000 and having at least one polymerizable unsaturated group per molecule, and (c) an inorganic porous material. By the use of the photosensitive resin composition of the present invention, it becomes possible to produce a printing element which not only has high uniformity in thickness and high dimensional precision, but also generates only a small amount of debris during the laser engraving of the printing element. Further, the produced printing element is advantageous in that a precise image can be formed on the printing element by laser engraving and the resultant image-bearing printing plate has small surface tack. Further, the present invention is also concerned with a laser engravable printing element formed from the photosensitive resin composition of the present invention.

2. Prior Art

The flexographic printing method is used in the production of packaging materials (such as a cardboard, a paperware, a paper bag and a flexible packaging film) and materials for construction and furnishing (such as a wall paper and an ornamental board) and also used for printing labels. Such flexographic printing method has been increasing its importance among other printing methods. A photosensitive resin is generally employed for producing a flexographic printing plate, and the production of a flexographic printing plate using a photosensitive resin has conventionally been performed by the following method. A photo-mask bearing a pattern is placed on a liquid resin or a solid resin sheet (obtained by molding a resin into a sheet), and the resultant masked resin is imagewise exposed to light, to thereby crosslink the exposed portions of the resin, followed by developing treatment in which the unexposed portions of the resin (i.e., uncrosslinked resin portions) are washed away with a developing liquid. Recently, the so-called "flexo CTP (Computer to Plate) method" has been developed. In this method, a thin, light absorption layer called "black layer" is formed on the surface of a photosensitive resin plate, and the resultant resin plate is irradiated with laser to ablate (evaporate) desired portions of the black layer to form a mask bearing an image (formed by the unablated portions of the black layer) on the resin plate directly without separately preparing a mask. Subsequently, the resultant resin plate is imagewise exposed to light through the mask, to thereby crosslink the exposed portions of the resin, followed by developing treatment in which the unexposed portions of the resin (i.e., uncrosslinked resin portions) are washed away with a developing liquid. Since the efficiency for producing the printing plates has been improved by this method, its use is beginning to expand in wide variety of fields. However, this method also requires a developing treatment as in the case of other methods and, hence, the improvement in the efficiency for producing the printing plates is limited. Therefore, it has been desired to develop a method for forming a relief pattern directly on a printing element by using a laser without a need for a developing treatment.

As an example of a method for producing a printing plate by directly forming a relief pattern on a printing element using laser, which does not require the developing treatment, there can be mentioned a method in which a printing element is engraved directly with laser. Such a method is already used for producing relief plates and stamps, in which various materials are used for forming the printing elements.

In the following specific examples of the above-mentioned method for producing a printing plate (by directly forming a relief pattern on a printing element using laser), the term "printing element" means an element prior to the engraving with laser, and the "printing plate" means a plate obtained by engraving the printing element with laser to form a relief pattern on the printing element.

Examined Japanese Patent Publication No. Sho 47-5121 (corresponding to U.S. Pat. No. 3,549,733) discloses the use of a polyoxymethylene or polychloral for producing a printing element. Further, Japanese Patent Application prior-to-examination Publication (Tokuhyo) No. Hei 10-512823 (corresponding to DE 19625749 A) describes the use of a silicone polymer or silicone fluoropolymer for producing a printing element. In each of the specific examples of compositions used for producing the printing element, which are described in this patent document, fillers, such as amorphous silica, are added to the above-mentioned polymer. However, a photosensitive resin is not used in the inventions disclosed in the above-mentioned patent documents. In the above-mentioned Japanese Patent Application prior-to-examination Publication (Tokuhyo) No. Hei 10-512823, amorphous silica is added to the polymer for enhancing the mechanical properties of the polymer and reducing the amount of an expensive elastomer used in the printing element. Further, this patent document has no description about the morphology of the amorphous silica used.

Unexamined Japanese Patent Application Laid-Open Specification No. 2001-121833 (corresponding to EP 1080883 A) describes the use of a mixture of a silicone rubber and carbon black for producing a printing element, wherein the carbon black is used as a laser beam absorber. However, a photosensitive resin is not used in this invention.

Unexamined Japanese Patent Application Laid-Open Specification No. 2001-328365 discloses the use of a graft-copolymer as a material for producing a printing element. Further, this patent document describes that, for improving the mechanical properties of the graft copolymer, inorganic silica having a particle diameter which is smaller than the wavelength of the visible light may be mixed with the graft copolymer. However, this patent document has no description about the removal of liquid debris which is generated by laser engraving. Further, in the Working Examples of this patent document, a sheet of a photosensitive resin was formed from a liquefied photosensitive resin which had been prepared by adding a solvent to the resin; however, the production of such a sheet is disadvantageous in that it was necessary to remove the solvent by drying. In addition, the production of the above-mentioned sheet has drawbacks in that the working environment which is appropriate for the use of a solvent must be maintained and that the complete removal of solvent from the inside of the produced printing element is difficult when the thickness of the printing element is in the order of several millimeters.
}

Unexamined Japanese Patent Application Laid-Open Specification No. 2002-3665 uses an elastomer composed mainly of ethylene monomer units, and this patent document describes that silica may be added to the elastomer as a reinforcing agent. In the Working Examples of this patent document, 50 parts by weight of porous silica and 50 parts by weight of calcium carbonate were added to 100 parts by weight of a resin. Both of the above-mentioned porous silica and calcium carbonate were used only as white reinforcing agents and, for achieving a satisfactory reinforcing effect, those reinforcing agents were used in large amounts (total amount of the reinforcing agents was as large as 100 parts by weight). That is, the use of silica in this patent document does not extend beyond the customary use as a reinforcing agent. Further, the resin used in this patent document is not a photosensitive resin and the resin is cured by heating. Therefore, the curing rate of the resin is low and the dimensional precision of a sheet obtained from the resin is poor.

DE 19918363 A discloses an invention in which a printing element is produced from a polymer produced from recycled materials. This patent document describes not only a heat curable resin, but also a photosensitive resin. In the single Example of this patent document, a resin composition containing a heat curable resin and carbon black is used. The addition of even a small amount of carbon black to a resin leads to a lowering of the light transmittance of the resin. Thus, it is impossible to cure a resin composition (such as produced in the single Example of DE 19918363 A) containing more than 1% by weight of carbon black from the outer portion thereof through the inner portion thereof. Therefore, such a resin composition is not suitable for use in the production of a laser engravable printing element. The lowering of the curability of a resin by the addition of carbon black markedly occurs especially when a liquid photosensitive resin is used. Further, this patent document has no description about either an inorganic porous material other than carbon black or the removal of liquid debris generated by laser engraving.

Each of Japanese Patent No. 2846954 (corresponding to U.S. Pat. No. 5,798,202) and Japanese Patent No. 2846955 (corresponding to U.S. Pat. No. 5,804,353) discloses the use of a reinforced elastomer material obtained by mechanically, photochemically and thermochemically reinforcing a thermoplastic elastomer, such as SBS (polystyrene-polybutadiene-polystyrene), SIS (polystyrene-polyisoprene-polystyrene) and SEBS (poly-styrene-polyethylene/polybutadiene-polystyrene). When a printing element formed from a thermoplastic elastomer is engraved with a laser beam having an oscillation wavelength within the infrared region, even portions of the printing element which are distant from the portion irradiated with the laser beam also tend to be melted by heat. Therefore, the resultant printing element cannot be used for preparing an engraved pattern having a high resolution. For removing this problem, it is necessary to add a filler to the thermoplastic elastomer to thereby enhance the mechanical properties thereof. In each of the above-mentioned patent documents, for enhancing the mechanical properties of the thermoplastic elastomer and improving the absorption of the laser beam by the thermoplastic elastomer, carbon black having excellent ability to enhance the mechanical properties of a resin is added to a thermoplastic elastomer. However, since carbon black is added to the elastomer, light transmittance of the elastomer is lowered, which is disadvantageous when it is attempted to crosslink the elastomer by irradiation (i.e., when it is attempted to perform a photochemical reinforcement of the elastomer). Therefore, when the above-mentioned reinforced elastomer material is subjected to laser engraving, it results in a generation of a large amount of debris (including viscous liquid material) which is difficult to remove. The generation of such debris not only necessitates a time-consuming treatment for removing the debris, but also causes problems, such as the imprecise boundary between elastomer portions which have been melted by laser beam irradiation and unmolten elastomer portions which form the relief pattern, the swelling of the edges of the unmolten elastomer portions forming the relief pattern, the adherence of the molten elastomer to the surfaces and/or sides of the unmolten elastomer portions forming the relief pattern, and the destruction of portions of the relief pattern which correspond to the dots of a print obtained using the relief pattern.

Further, when a large amount of liquid debris, which is presumed to be a laser decomposition product of the resin, is generated during the laser engraving of the printing element, the liquid debris stains the optical parts of a laser engraving apparatus. When the liquid debris is attached to the surface of optical parts, such as a lens and a mirror, the resin causes serious troubles of the apparatus, such as burnout of the apparatus.

As apparent from the above, various materials for laser engraving have been proposed. However, a material for forming a laser engravable printing element, which not only has high uniformity in thickness and high dimensional precision, but also enables easy laser engraving without suffering problems caused by the generation of debris, has not yet been realized.

SUMMARY OF THE INVENTION

In this situation, the present inventors have made extensive and intensive studies with a view toward developing a photosensitive resin composition which is suitable as a material for forming a printing element used for producing an image-bearing printing plate, wherein the image-bearing printing plate is produced by removing a part of the printing element by laser beam irradiation. As a result, it has surprisingly been found that, when a printing element is formed from a specific resin composition which comprises a photosensitive resin (which is easily decomposed by laser beam irradiation) and an inorganic porous material (which is used for absorption removal of viscous liquid debris generated in a large amount due to the use of the easily decomposable resin), the formed printing element not only has high uniformity in thickness and high dimensional precision, but also generates only a small amount of debris during the laser engraving of the printing element. Further, the formed printing element is advantageous in that a precise image can be formed on the printing element by laser engraving and the resultant image-bearing printing plate has small surface tack. The present invention has been completed, based on these novel findings.

Accordingly, it is an object of the present invention to provide a photosensitive resin composition which is especially advantageous for use in the production of a relief printing plate, which production is conventionally accompanied by a generation of a large amount of engraving debris.

It is another object of the present invention to provide a laser engravable printing element formed from the above-mentioned resin composition.

The foregoing and other objects, features and advantages of the present invention will be apparent from the following detailed description taken in connection with the appended claims.

DETAILED DESCRIPTION OF THE INVENTION

In one aspect of the present invention, there is provided a photosensitive resin composition for forming a laser engravable printing element, comprising:

(a) 100 parts by weight of a resin which is a plastomer at 20° C., wherein the resin has a number average molecular weight of from 1,000 to 100,000 and has a polymerizable unsaturated group in an amount such that-the average number of the polymerizable unsaturated group per molecule is at least 0.7, (b) 5 to 200 parts by weight, relative to 100 parts by weight of the resin (a), of an organic compound having a number average molecular weight of less than 1,000 and having at least one polymerizable unsaturated group per molecule, and (c) 1 to 100 parts by weight, relative to 100 parts by weight of the resin (a), of an inorganic porous material.

For easy understanding of the present invention, the essential features and various embodiments of the present invention are enumerated below.

1. A photosensitive resin composition for forming a laser engravable printing element, comprising:

(a) 100 parts by weight of a resin which is a plastomer at 20° C., wherein the resin has a number average molecular weight of from 1,000 to 100,000 and has a polymerizable unsaturated group in an amount such that the average number of the polymerizable unsaturated group per molecule is at least 0.7, (b) 5 to 200 parts by weight, relative to 100 parts by weight of the resin (a), of an organic compound having a number average molecular weight of less than 1,000 and having at least one polymerizable unsaturated group per molecule, and (c) 1 to 100 parts by weight, relative to 100 parts by weight of the resin (a), of an inorganic porous material.

2. The photosensitive resin composition according to item 1 above, wherein the inorganic porous material (c) has a number average particle diameter of from 0.1 μm to 100 μm, an average pore diameter of from 1 nm to 1,000 nm, and a pore volume of from 0.1 ml/g to 10 ml/g.

3. The photosensitive resin composition according to item 1 or 2 above, wherein the resin composition further comprises (d) a photopolymerization initiator.

4. The photosensitive resin composition according to any one of items 1 to 3 above, wherein at least 20% by weight of the organic compound (b) is a compound having at least one functional group selected from the group consisting of an alicyclic functional group and an aromatic functional group.

5. The photosensitive resin composition according to any one of items 1 to 4 above, wherein the inorganic porous material (c) has a specific surface area of from 10 $m^2$/g to 1,500 $m^2$/g, and exhibits an oil absorption of from 10 ml/100 g to 2,000 ml/100 g.

6. The photosensitive resin composition according to any one of items 1 to 5 above for use in forming a relief printing element.

7. A laser engravable printing element which is a cured photosensitive resin composition having a shape of a sheet or cylinder, wherein the laser engravable printing element contains an inorganic porous material.

8. A multi-layered, laser engravable printing element comprising a printing element layer and at least one elastomer layer provided below the printing element layer, wherein the printing element layer is made of the laser engravable printing element of item 7 above and the elastomer layer has a Shore A hardness of from 20 to 70.

9. The multi-layered, laser engravable printing element according to item 8 above, wherein the elastomer layer is produced by photocuring a resin which is in a liquid state at room temperature.

10. A laser engravable printing element obtainable by a process comprising:

shaping the photosensitive resin composition according to any one of items 1 to 6 above into a sheet or cylinder, and crosslink-curing the photosensitive resin composition by light or electron beam irradiation.

11. A multi-layered, laser engravable printing element comprising a printing element layer and at least one elastomer layer provided below the printing element layer, wherein the printing element layer is made of the laser engravable printing element of item 10 above and the elastomer layer has a Shore A hardness of from 20 to 70.

12. The multi-layered, laser engravable printing element according to item 11 above, wherein the elastomer layer is produced by photocuring a resin which is in a liquid state at room temperature.

13. A laser engravable printing element obtained by a process comprising:

shaping the photosensitive resin composition according to any one of items 1 to 6 above into a sheet or cylinder, and crosslink-curing the photosensitive resin composition by light or electron beam irradiation.

14. A multi-layered, laser engravable printing element comprising a printing element layer and at least one elastomer layer provided below the printing element layer, wherein the printing element layer is made of the laser engravable printing element of item 13 above and the elastomer layer has a Shore A hardness of from 20 to 70.

15. The multi-layered, laser engravable printing element according to item 14 above, wherein the elastomer layer is produced by photocuring a resin which is in a liquid state at room temperature.

Hereinbelow, the present invention is explained in more detail.

The photosensitive resin composition of the present invention comprises (a) 100 parts by weight of a resin which is a plastomer at 20° C., wherein the resin has a number average molecular weight of from 1,000 to 100,000 and has a polymerizable unsaturated group in an amount such that the average number of the polymerizable unsaturated group per molecule is at least 0.7, (b) 5 to 200 parts by weight, relative to 100 parts by weight of resin (a), of an organic compound having a number average molecular weight of less than 1,000 and having at least one polymerizable unsaturated group per molecule, and (c) 1 to 100 parts by weight, relative to 100 parts by weight of resin (a), of an inorganic porous material. In the present invention, the term "laser engravable printing element" means a cured resin material which is used as a base material of a printing plate, namely a cured resin material prior to the laser engraving.

The photosensitive resin composition of the present invention is a plastomer at 20° C. because resin (a), which is the main component of the resin composition, is a plastomer. In the present invention, the term "plastomer" means, as defined in "Shinpan Koubunshi Jiten (Polymer Dictionary, New Edition" edited by Society of Polymer Science Japan (published in 1988 by Asakura Shoten, Japan), a polymer which has the ability to be relatively easily deformed, or the ability to be easily flowed by heating and be solidified upon cooling. This "plastomer" is a term which is against the term "elastomer" (which means a material having the ability to change a shape thereof in accordance with a force applied thereto and to recover the original shape thereof within a short period of time after released from the force).

The viscosity of the photosensitive resin composition of the present invention at 20° C. is preferably from 10 Pa·s to 10 kPa·s, more preferably from 50 Pa·s to 5 kPa·s. When the viscosity of the resin composition is in the above-mentioned range, such a resin composition can be easily shaped into a sheet or cylinder, and the shaping process can be performed with ease. On the other hand, when the viscosity of the resin composition is less than 10 Pa·s, the ability of the inorganic porous material to absorb the debris becomes unsatisfactory. The reason for this has not yet been elucidated, but it is considered that a low viscosity photosensitive resin composition is likely to enter the micropores and voids of the inorganic porous material, to thereby fill up many of the micropores and voids, thus preventing the inorganic porous material from absorbing the debris. Further, when a printing element is produced from a resin composition having a viscosity of less than 10 Pa·s, the mechanical strength of the printing element becomes unsatisfactory. In addition, shaping of the resin composition into a cylindrical printing element becomes difficult and, even when a cylindrical printing element is obtained, the preservation of the cylindrical shape of the printing element becomes difficult. On the other hand, when the viscosity of the resin composition exceeds 10 kPa·s, shaping of such a resin composition and processing of the shaped article become difficult at room temperature. In the present invention, as mentioned above, the resin composition is a plastomer and, hence, a relief printing element (in the form of a sheet or cylinder) formed from the resin composition has high uniformity in thickness and high dimensional precision.

With respect to resin (a) used for producing the photosensitive resin composition of the present invention, there is no particular limitation so long as the resin is a plastomer at 20° C., has a number average molecular weight of from 1,000 to 100,000 and has a polymerizable unsaturated group in an amount such that the average number of the polymerizable unsaturated group per molecule is at least 0.7.

The number average molecular weight of resin (a) is in the range of from 1,000 to 100,000, preferably from 2,000 to 100,000, more preferably from 5,000 to 100,000. When a resin composition is produced using resin (a) having a number average molecular weight in the above-mentioned range, such a resin composition exhibits excellent processability. Further, a printing element obtained by crosslink-curing such a resin composition exhibits high strength, and a relief structure formed from the printing element also exhibits high strength and endures repeated use. On the other hand, when a resin composition is produced using resin (a) having a number average molecular weight of less than 1,000, the strength of the printing element produced from such a resin composition becomes unsatisfactory. Further, when a resin composition is produced using resin (a) having a number average molecular weight of more than 100,000, the viscosity of such a resin composition becomes too high and a complicated processing method, such as heat extrusion, becomes necessary for producing a laser engravable printing element having a shape of a sheet or cylinder. The number average molecular weight of resin (a) is determined by GPC (gel permeation chromatography) in which a calibration curve prepared using standard polystyrene samples is employed.

Further, resin (a) has a polymerizable unsaturated group in an amount such that the average number of the polymerizable unsaturated group per molecule is at least 0.7. In the present invention, the "polymerizable unsaturated group" means a polymerizable unsaturated group which participates in a radical or addition polymerization reaction. Preferred examples of polymerizable unsaturated groups which participate in a radical polymerization reaction include a vinyl group, an acetylene group, an acryl group, a methacryl group and an allyl group. Preferred examples of polymerizable unsaturated groups which participate in an addition polymerization reaction include a cinnamoyl group, a thiol group, an azido group, an epoxy group which participates in a ring-opening addition reaction, an oxetane group, a cyclic ester group, a dioxysilane group, a spiro-o-carbonate group, a spiro-o-ester group, a bicyclo-o-ester group, a cyclohexane group and a cyclic iminoether group.

The polymerizable unsaturated group present in the molecule of resin (a) may be an unsaturated group which is bonded directly to the terminal of a main chain or side chain of resin (a), or to the non-terminal portion of the main chain or side chain of resin (a). By the use of resin (a) which has a polymerizable unsaturated group in an amount such that the average number of the polymerizable unsaturated group per molecule is at least 0.7, a printing element formed from the resin composition of the present invention exhibits excellent mechanical strength and the relief structure formed on the printing element is unlikely to suffer distortion during the laser engraving. Further, the relief structure exhibits excellent durability and endures repeated use. From the viewpoint of obtaining a printing element having excellent mechanical strength, it is preferred that resin (a) has the polymerizable unsaturated group in an amount such that the average number of the polymerizable unsaturated group per molecule of resin (a) is more than 1. The increase in the average number of the polymerizable unsaturated group per molecule of resin (a) leads to an improvement in the solvent resistance and mechanical strength of the resin composition. When a resin (a) molecule has polymerizable unsaturated groups only at the terminals thereof, the number of the polymerizable unsaturated groups contained in the resin (a) molecule is 2, but when the resin (a) molecule has a branched structure in which the polymerizable functional group(s) is/are bonded to side chain(s), the number of the polymerizable unsaturated groups contained in the resin (a) molecule becomes more than 2. Therefore, it is impossible to limit the maximum number of the polymerizable unsaturated groups contained in a resin (a) molecule, but it is considered to be about 20. The average number of the polymerizable unsaturated group per molecule of resin (a) is determined by the molecular structure analysis of resin (a), which is performed by NMR (nuclear magnetic resonance spectroscopy). Specifically, in the present invention, $^1$H (proton) NMR is used for the analysis. $^{13}$C-NMR can be used in combination with the proton NMR. In the case of the proton NMR, from the viewpoint of achieving excellent resolution in the NMR spectrum, it is preferred that the detection frequency of the NMR apparatus is 100 MHz or more.

Specific examples of resins which can be used in resin (a) include polymers in which component monomer units are bonded through carbon-carbon linkages, such as polyolefins (e.g., a polyethylene and a polypropylene), polydienes (e.g., a polybutadiene and a polyisoprene), polyhaloolefins (e.g., a polyvinyl chloride and a polyvinilidene chloride), a polystyrene, a polyacrylonitrile, a polyvinyl alcohol, a polyvinyl acetate, a polyvinyl acetal, a polyacrylic acid, a poly(meth) acrylate, a poly(meth)acrylamide and a polyvinyl ether; polyethers, such as a polyphenylene ether; and polymers comprising a heteroatom in the main chain thereof, such as a polyethylene terephthalate, a polycarbonate, a polyacetal, a polyurethane, a nylon, a polyurea and a polyimide. One or more polymers can be used in resin (a). When a plurality of different polymers is used in combination, the polymers may be in the form of either a copolymer or a polymer blend.

Especially when it is intended to obtain a resin composition which can be used for forming a flexible relief pattern, such as the relief pattern of a flexographic printing plate, it is preferred that at least a part of resin (a) is a plastomer having a glass transition temperature of 20° C or less, more preferably 0° C. or less. Examples of such plastomers include hydrocarbon polymers, such as a polyethylene, a polybutadiene, a hydrogenated polybutadiene, a polyisoprene and a hydrogenated polyisoprene; polyesters, such as a polyadipate and a polycaprolactone; polyethers, such as a polyethylene glycol, a polypropylene glycol and a polytetramethylene glycol; aliphatic polycarbonates; silicones, such as a polydimethylsiloxane; polymers of acrylic acid, (meth)acrylic acid and/or derivatives thereof; and mixtures and copolymers thereof. It is preferred that the above-mentioned plastomer having a low glass transition temperature is used in an amount of from 30 to 100% by weight, based on the total weight of the resins used as resin (a).

When it is intended to emboss the photosensitive resin composition of the present invention, it is preferred that resin (a) is a rigid resin, such as a polyurethane or a polyimide.

With respect to the method for obtaining resin (a), for example, there can be mentioned a method in which a polymerizable unsaturated group is directly introduced to the terminals of a polymer (e.g., any of the above-mentioned polymers which can be used in resin (a)). As another example of the method for obtaining resin (a), there can be mentioned the following method. A reactive polymer is produced by introducing a plurality of reactive groups (such as a hydroxyl group, an amino group, an epoxy group, a carboxyl group, an acid anhydride group, a ketone group, a hydrazine group, an isocyanate group, an isothiocyanate group, a cyclic carbonate group and an ester group) into a polymer (e.g., any of the above-mentioned polymers which can be used in resin (a)) which has a molecular weight of several thousands. The produced reactive polymer is reacted with a binding compound capable of binding to the reactive groups of the polymer (for example, when the reactive group of the polymer is a hydroxyl group or an amino group, a polyisocyanate can be used as the binding compound), to thereby adjust the molecular weight of the polymer and convert the terminals of the polymer into binding groups. Subsequently, an organic compound having a polymerizable unsaturated group as well as a group which is capable of reacting with the terminal binding groups of the reactive polymer is reacted with the reactive polymer to introduce the polymerizable unsaturated group into the terminals of the reactive polymer, thereby obtaining resin (a).

Organic compound (b) used for producing the photosensitive resin composition of the present invention is an organic compound having a number average molecular weight of less than 1,000 and having at least one polymerizable unsaturated group per molecule. From the viewpoint of ease in blending organic compound (b) with resin (a), the number average molecular weight of the organic compound (b) must be less than 1,000. With respect to the design of a photosensitive resin composition, in general, the combination of a compound having a relatively high molecular weight and a compound having a relatively low molecular weight is effective for producing a resin composition which exhibits excellent mechanical properties after being cured. When a photosensitive resin composition is produced using only compounds having relatively low molecular weights, such a resin composition is disadvantageous not only in that the resin composition suffers a marked cure shrinkage at the time of photocuring, but also in that a long time is needed for the curing the resin composition. On the other hand, when a photosensitive resin composition is produced using only compounds having relatively high molecular weights, it becomes difficult to cure such a resin composition and obtain a cured resin having excellent properties. Therefore, in the present invention, resin (a) having a high molecular weight and organic compound (b) having a low molecular weight are used in combination.

The number average molecular weight of the organic compound (b) is determined as follows. When the ratio of the weight average molecular weight Mw to the number average molecular weight Mn (i.e., the polydispersity Mw/Mn), which are determined by GPC, is 1.1 or more, the number average molecular weight is defined as the Mn value determined by GPC. When the polydispersity is 1.0 or more and less than 1.1 and only a single peak is observed in the gel permeation chromatogram, the molecular weight distribution of the organic compound (b) is very small. In such a case, the number average molecular weight is determined by GPC-MS (a method in which a mass spectroscopy is performed with respect to each component separated by gel permeation chromatography). When the polydispersity is less than 1.1 and a plurality of peaks are observed in the gel permeation chromatogram (i.e., when the organic compound (b) is a mixture of a plurality of different compounds (b) having different molecular weights), the weight ratio of the different compounds (b) is calculated from the area ratio of the peaks observed in the gel permeation chromatogram, and the number average molecular weight of the organic compound (b) is determined using the weight ratio of the different compounds (b).

As in the case of the "polymerizable unsaturated group" of resin (a) which is explained above, the "polymerizable unsaturated group" of organic compound (b) means a polymerizable unsaturated group which participates in a radical or addition polymerization reaction. Preferred examples of polymerizable unsaturated groups which participate in a radical polymerization reaction include a vinyl group, an acetylene group, an acryl group, a methacryl group and an allyl group. Preferred examples of polymerizable unsaturated groups which participate in an addition polymerization reaction include a cinnamoyl group, a thiol group, an azido group, an epoxy group which participates in a ring-opening addition reaction, an oxetane group, a cyclic ester group, a dioxysilane group, a spiro-o-carbonate group, a spiro-o-ester group, a bicyclo-o-ester group, a cyclohexane group and a cyclic iminoether group. There is no particular limitation with respect to the number of polymerizable unsaturated groups of organic compound (b) so long as the organic compound (b) has at least one polymerizable unsaturated group per molecule. It is impossible to limit the maximum number of the polymerizable unsaturated group per molecule for the same reason as mentioned above in connection with resin (a), but it is considered to be about 10. As in the case of resin (a), in the present invention, the number of the polymerizable unsaturated group per molecule of the organic compound (b) is a value determined by $^1$H-NMR.

Specific examples of organic compound (b) include olefins, such as ethylene, propylene, styrene and divinylbenzene; acetylene type compounds; (meth)acrylic acid and derivatives thereof; haloolefins; unsaturated nitriles, such as acrylonitrile; (meth)acrylamide and derivatives thereof; allyl compounds, such as an allyl alcohol and an allyl isocyanate; unsaturated dicarboxylic acids (such as maleic anhydride, maleic acid and fumaric acid) and derivatives thereof; vinyl acetate; N-vinylpyrrolidone; and N-vinylcarbazole. From the viewpoint of various advantages, such as availability of various types of products, reasonable price and decomposability by laser beam irradiation, (meth)acrylic acid and derivatives thereof are preferred. The above-mentioned compounds (b) can be used individually or in combination depending on the use of the photosensitive resin composition.

Examples of derivatives of the compounds mentioned above as compound (b) include compounds having an alicyclic group, such as a cycloalkyl group, a bicycloalkyl group, a cycloalkylene group or a bicycloalkylene group; compounds having an aromatic group, such as a benzyl group, a phenyl group, a phenoxy group or a fluorenyl group; compounds having a group, such as an alkyl group, a halogenated alkyl group, an alkoxyalkyl group, a hydroxyalkyl group, an aminoalkyl group, a tetrahydrofurfuryl group, an allyl group or a glycidyl group; esters with a polyol, such as an alkylene glycol, a polyoxyalkylene glycol, an (alkyl/allyloxy)polyalkylene glycol or trimethylol propane. Organic compound (b) can be a heterocyclic type aromatic compound containing nitrogen, sulfur or the like as a heteroatom. For example, since the printing element formed by the photosensitive resin composition of the present invention is used for forming a printing plate, for suppressing the swelling of the printing plate by a solvent for the printing ink (i.e., an organic solvent, such as an alcohol or an ester), it is preferred that organic compound (b) is a compound having a long chain aliphatic group, an alicyclic group or an aromatic group.

Further, especially when it is intended to use the resin composition of the present invention in the field where the resin composition is required to have high rigidity, it is preferred that organic compound (b) is a compound having an epoxy group which participates in a ring-opening addition reaction. As compounds having an epoxy group which participates in a ring-opening addition reaction, there can be mentioned compounds which are obtained by reacting epichlorohydrin with any of various polyols (such as diols and triols); and epoxy compounds obtained by reacting a peracid with an ethylenic bond in an ethylenic bond-containing compound. Specific examples of such compounds include ethylene glycol diglycidyl ether, diethylene glycol diglycidyl ether, triethylene glycol diglycidyl ether, tetraethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerin diglycidyl ether, glycerin triglycidyl ether, trimethylol propane triglycidyl ether, bisphenol A diglycidyl ether, hydrogenated bisphenol A diglycidyl ether, diglycidyl ethers of a compound formed by addition-bonding ethylene oxide or propylene oxide to bisphenol A, polytetramethylene glycol diglycidyl ether, poly(propylene glycol adipate)diol diglycidyl ether, poly(ethylene glycol adipate)diol diglycidyl ether, poly(caprolactone)diol diglycidyl ether, 3,4-epoxycyclohexylmethyl 3',4'-epoxycyclohexylcarboxylate, 1-methyl-3,4-epoxycyclohexylmethyl 1'-methyl-3',4'-epoxycyclohexylcarboxylate, bis[1-methyl-3,4-epoxycyclohexyl] adipate, vinylcyclohexene diepoxide, polyepoxy compounds (each independently obtained by reacting a peracetic acid with a polydiene (such as polybutadiene or polyisoprene)), and epoxidized soybean oil.

In the present invention, it is preferred that at least 20% by weight, more preferably 50 to 100% by weight of organic compound (b) is a compound having at least one functional group selected from the group consisting of an alicyclic functional group and an aromatic functional group. The mechanical strength and solvent resistance of the photosensitive resin composition can be improved by the use of organic compound (b) having an alicyclic functional group and/or an aromatic functional group. Examples of alicyclic functional groups contained in the organic compound (b) include a cycloalkyl group, a bicycloalkyl group, a cycloalkene skeleton and a bicycloalkene skeleton, and examples of organic compounds (b) having an alicyclic group include cyclohexyl methacrylate. Examples of aromatic functional groups contained in the organic compound (b) include a benzyl group, a phenyl group, a phenoxy group and a fluorene group, and examples of organic compounds (b) having an aromatic group include benzyl methacrylate and phenoxyethyl methacrylate. Organic compound (b) containing an aromatic functional group can be a heterocyclic type aromatic compound containing nitrogen, sulfur and the like as a heteroatom.

For improving the impact resilience of a printing plate obtained from the photosensitive resin composition of the present invention, the type of the organic compound (b) can be appropriately selected, based on the conventional knowledge on photosensitive resin compositions for forming printing plates (for example, a methacyrlic monomer described in Unexamined Japanese Patent Application Laid-Open Specification No. Hei 7-239548 can be used).

The photosensitive resin composition of the present invention comprises inorganic porous material (c). Inorganic porous material (c) is inorganic microparticles having micropores and/or very small voids. In the present invention, a photosensitive resin having a relatively low molecular weight is used to produce the photosensitive resin composition so as to enable an easy engraving with laser beam; therefore, when the polymer chains of the photosensitive resin are broken by laser beam, viscous liquid debris composed of low molecular weight components (i.e., monomers and oligomers) are generated in a large amount. In the present invention, inorganic porous material (c) is used to conduct an absorption removal of the generated liquid debris. Further, the presence of inorganic porous material (c) prevents the occurrence of surface tack of the printing plate. The removal of liquid debris by the inorganic porous material is a completely new technique which has not conventionally been known. The photosensitive resin composition of the present invention which is capable of quickly removing the liquid debris is especially advantageous for the formation of a flexographic printing plate, which formation is accompanied by a generation of a large amount of engraving debris.

In the present invention, as mentioned above, inorganic microparticles are used as inorganic porous material (c). The inorganic microparticles are used because they are not molten or deformed by laser beam irradiation and maintain their pores and/or small voids. Therefore, with respect to the material of the inorganic porous material (c), there is no particular limitation so long as the material is not molten by laser beam irradiation. However, when it is intended to photocure the photosensitive resin composition of the present invention by ultraviolet light or visible light, the use of black microparticles as inorganic porous material (c) is unfavorable since the black particles cause a marked lowering of the transmission of light to the inner portion of the resin composition, thereby lowering the properties of the cured resin composition. Thus, black microparticles, such as carbon black, activated carbon and graphite, are not suitable as inorganic porous material (c) used in the resin composition of the present invention.

The characteristics and properties of inorganic porous material (c), such as a number average particle diameter, a specific surface area, an average pore diameter, a pore volume, an ignition loss and an oil absorption, are very important factors for achieving an efficient removal of viscous liquid debris. Among the conventional microparticles which are used as additives for a photosensitive resin composition, there are nonporous microparticles and porous microparticles having too small pores which are incapable of satisfactorily absorbing the liquid debris. In addition to the above-mentioned characteristics and properties of inorganic porous material (c), the molecular weight and viscosity of the photosensitive resin also have a great influence on the efficiency of the removal of the viscous liquid debris. It is preferred that the porous material which is used as inorganic porous material (c) in the present invention has a number average particle diameter of from 0.1 µm to 100 µm, an average pore diameter of from 1 nm to 1,000 nm, and a pore volume of from 0.1 ml/g to 10 ml/g.

In the present invention, the number average particle diameter of the inorganic porous material (c) is preferably in the range of from 0.1 µm to 100 µm, more preferably from 0.5 to 20 µm, most preferably from 3 to 10 µn. When a porous material having a number average particle diameter of less than 0.1 µm is used in the photosensitive resin composition, dust arises during the laser engraving of the printing element formed from the photosensitive resin composition, thereby staining the engraving apparatus with the dust. Further, when such an inorganic porous material is mixed with resin (a) and organic compound (b), problems are likely to arise, such as an increase in the viscosity of the resultant mixture, an incorporation of air bubbles into the mixture, and a generation of dust. On the other hand, when a porous material having a number average particle diameter of more than 100 µm is used to produce a photosensitive resin composition, disadvantages are likely to be caused wherein the relief pattern formed on the printing element by laser engraving is chipped, so that an image of a print obtained using the relief pattern becomes imprecise. In the present invention, the average pore diameter is determined by means of a laser scattering particle size distribution analyzer.

The average pore diameter of inorganic porous material (c) has a great influence on the ability thereof to absorb the liquid debris which is generated during the laser engraving. The average pore diameter is preferably in the range of from 1 nm to 1,000 nm, more preferably from 2 nm to 200 nm, still more preferably from 2 nm to 50 nm. When the average pore diameter of an inorganic porous material is less than 1 nm, such an inorganic porous material is incapable of absorbing a satisfactory amount of the liquid debris generated during the laser engraving. On the other hand, when the average pore diameter of an inorganic porous material exceeds 1,000 nm, the specific surface area of such an inorganic porous material becomes too small to absorb a satisfactory amount of the liquid debris. The reason why an inorganic porous material having an average pore diameter of less than 1 nm cannot absorb a satisfactory amount of the liquid debris is not fully elucidated, but it is considered that the viscous liquid debris is difficult to enter into the micropores having such a small average pore diameter. For example, a zeolite, a mordenite, a hollandite, a todorokite and a faujasite are porous materials having micropores of less than 1 nm. Each of these porous material has a large specific surface area; however, their ability to remove the liquid debris is low. Among various porous materials, those which have an average pore diameter of from 2 to 50 nm are called "mesoporous materials". Such mesoporous materials are especially preferred in the present invention because the mesoporous materials have remarkably high ability to absorb the liquid debris. In the present invention, the average pore diameter is determined by the nitrogen adsorption method. In addition, the pore diameter distribution can also be determined by the nitrogen adsorption method using a nitrogen adsorption isotherm obtained at −196° C.

The pore volume of inorganic porous material (c) is preferably in the range of from 0.1 ml/g to 10 ml/g, more preferably from 0.2 ml/g to 5 ml/g. When the pore volume of an inorganic porous material is less than 0.1 ml/g, such an inorganic porous material is incapable of absorbing a satisfactory amount of the liquid debris generated during the laser engraving. On the other hand, when the pore volume exceeds 10 ml/g, the mechanical properties of the particles become unsatisfactory. In the present invention, the pore volume is a value determined by the nitrogen adsorption method. Specifically, the pore volume is determined from a nitrogen adsorption isotherm obtained at −196° C.

In order to evaluate the porous structure of a porous material, the present inventors have adopted a new parameter called "specific porosity". The "specific porosity" of porous particles is the ratio of the specific surface area (P) of the particles to the surface area (S) per unit weight of the particles, namely P/S, wherein S is a value calculated from the average pore diameter (D) (unit: µm) of the particles and the density (d) (unit: g/cm$^3$) of a substance constituting the particles. With respect to the surface area (S) per unit weight of the porous particles, when the particles are spherical, the average surface area of the particles is $\pi D^2 \times 10^{-12}$ (unit: m$^2$) and the average weight of the particles is $(\pi D^3 \, d/6) \times 10^{-12}$ (unit: g). Accordingly, the surface area (S) per unit weight of the particles is calculated by the following formula:

$$S=6/(Dd) \text{ (unit: m}^2/\text{g)}$$

When the porous particles are not spherical, certain particles are chosen, and the surface area (S) per unit weight of the particles is calculated on the assumption that the chosen particles are spheres wherein the maximum axes of the chosen particles are defined as the diameters of the spheres.

The specific surface area (P) is a value calculated from the amount of molecular nitrogen adsorbed on the surface of a particle.

The specific surface area P increases as the particle diameter decreases and, therefore, the specific surface area alone is inappropriate as a parameter for defining the porous structure of a porous material. Therefore, the present inventors have adopted the above-mentioned "specific porosity" as a nondimensional parameter, taking into consideration the particle diameter of the porous material. It is preferred that the inorganic porous material (c) used in the present invention has a specific porosity of 20 or more, more advantageously 50 or more, most advantageously 100 or more.

When the specific porosity of the inorganic porous material (c) is 20 or more, the inorganic porous material (c) is effective for the absorption removal of the liquid debris.

For example, carbon black, which is conventionally widely used as a reinforcing agent for a rubber and the like, has a very large specific surface area, namely 150 m$^2$/g to 20 m$^2$/g, and has a very small average particle diameter, generally 10 nm to 100 nm. Since it is known that carbon black generally has a graphite structure, the specific porosity of carbon black can be calculated using the density of graphite, i.e., 2.25 g/cm$^3$. The specific porosity of carbon black obtained by such calculation is in the range of from 0.8 to 1.0, which indicates that carbon black is a non-porous material. On the other hand, the porous silica used in the Examples of the present application have a specific porosity which is much larger than 500.

Further, for achieving excellent absorption, it is preferred that inorganic porous material (c) has a specific surface area of from 10 m$^2$/g to 1,500 m$^2$/g, and exhibits an oil absorption of from 10 ml/100 g to 2,000 ml/100 g.

The specific surface area of inorganic porous material (c) is preferably in the range of from 10 M$^2$/g to 1,500 m$^2$/g, more preferably from 100 m$^2$/g to 800 m$^2$/g. When the specific surface area of an inorganic porous material is less than 10 m$^2$/g, the ability thereof to remove the liquid debris generated during laser engraving is likely to become unsatisfactory. On the other hand, when the specific surface area of an inorganic porous material exceeds 1,500 m$^2$/g, a disadvantage is likely to be caused that the viscosity of the photosensitive resin composition containing the inorganic porous material is increased and the thixotropy of the photosensitive resin composition is increased. In the present invention, the specific surface area is determined by the BET method using the nitrogen adsorption isotherm obtained at $-196°$ C.

The oil absorption of inorganic porous material (c) is an index for evaluating the amount of liquid debris which the inorganic porous material can absorb, and it is defined as an amount of oil absorbed by 100 g of the inorganic porous material. The oil absorption of the inorganic porous material (c) used in the present invention is preferably in the range of from 10 ml/100 g to 2,000 ml/100 g, more preferably from 50 ml/100 g to 1,000 ml/100 g. When the oil absorption of an inorganic porous material is less than 10 ml/100 g, it is likely that such an inorganic porous material cannot effectively remove the liquid debris generated by laser engraving. On the other hand, when the oil absorption of an inorganic porous material exceeds 2,000 ml/100 g, the mechanical properties of such an inorganic porous material are likely to become unsatisfactory. The oil absorption is determined in accordance with JIS-K5101.

Since the photosensitive resin composition of the present invention is used for forming a laser engravable printing element, inorganic porous material (c) needs to maintain its porous structure without suffering deformation or melting by laser beam irradiation, especially infrared radiation. Therefore, it is desired that the ignition loss of inorganic porous material (c) at 950° C. for 2 hours is not more than 15% by weight, preferably not more than 10% by weight.

There is no particular limitation with respect to the shape of the particles of inorganic porous material (c), and each particle of inorganic porous material (c) may independently be in the form of a sphere, a plate or a needle. Alternatively, inorganic porous material (c) may not have any definite shape or may be in the form of particles each having a projection(s) on the surface thereof. Further, inorganic porous material (c) may be hollow particles or spherical granules, such as silica sponge, which have uniform pore diameter. Specific examples of inorganic porous material (c) include a porous silica, a mesoporous silica, a silica-zirconia porous gel, a mesoporous molecular sieve, a porous alumina and a porous glass.

In addition, a lamellar substance, such as a lamellar clay compound, having voids between the layers can be also used as inorganic porous material (c), wherein the size of each void (distance between the layers) ranges from several to 100 nm. In such a lamellar substance, the void between the layers thereof (i.e., the space between the layers) is defined as a pore, and the total amount of the spaces between the mutually adjacent layers is defined as a pore volume. These values can be obtained from the nitrogen adsorption isotherm.

In the present invention, the substances exemplified above as inorganic porous material (c) can be used individually or in combination.

In general, carbon black which has conventionally been used as an additive for a photosensitive resin is considered to have a graphite structure, namely a lamellar structure. In the graphite, each interval between the layers is very small, namely 0.34 nm, so that the absorption of viscous liquid debris by carbon black is difficult. In addition, since the color of carbon black is black, it exhibits strong light absorbing properties with respect to wide range of wavelengths (ranging from UV light to infrared light). Therefore, when carbon black is added to a photosensitive resin composition and the resultant resin composition is photocured with UV light and the like, it becomes necessary to limit the amount of carbon black to a very small amount. Accordingly, carbon black is not suitable as inorganic porous material (c) which is used for the absorption removal of viscous liquid debris.

In the present invention, inorganic porous material (c) having incorporated in its pores and/or voids an organic colorant (such as a pigment or a dye) which is capable of absorbing light having an wavelength of a laser beam can be used.

In addition, the surface of the inorganic porous material may be modified by coating the surface with a silane coupling agent, a titanium coupling agent or an organic compound, to thereby obtain particles having an improved hydrophilic or hydrophobic property.

The amounts of resin (a), organic compound (b) and inorganic porous material (c) used in the photosensitive resin composition of the present invention are as follows. In general, the amount of organic compound (b) is 5 to 200 parts by weight, preferably 20 to 100 parts by weight, relative to 100 parts by weight of resin (a). The amount of inorganic porous material (c) is 1 to 100 parts by weight, preferably 1 to 50 parts by weight, more preferably 2 to 35 parts by weight, still more preferably 2 to 20 parts by weight, most preferably 2 to 15 parts by weight, relative to 100 parts by weight of resin (a).

When the amount of organic compound (b) is less than 5 parts by weight, a printing plate or the like which is obtained from the photosensitive resin composition is likely to suffer disadvantages, such as a difficulty in maintaining a good balance between the rigidity of the composition, and the tensile strength and elongation of the composition. When the amount of organic compound (b) exceeds 200 parts by weight, the photosensitive resin composition is likely to suffer not only a marked cure shrinkage at the time of the crosslink-curing of the resin composition, but also a lowering of the uniformity in thickness of the resultant printing element.

When the amount of inorganic porous material (c) is less than 1 part by weight, depending on the types of resin (a) and organic compound (b) used, the abilities of the inorganic porous material to prevent surface tack and to remove the liquid debris generated by laser engraving become unsatisfactory. On the other hand, when the amount of inorganic porous material (c) exceeds 100 parts by weight, a printing plate which is obtained from the photosensitive resin composition becomes fragile and loses transparency. Especially when a flexographic printing plate is produced using a resin composition containing too large an amount of inorganic porous material (c), the rigidity of such a flexographic printing plate may become too high.

When a laser engravable printing element is formed by photocuring a photosensitive resin composition (especially when the photocuring is performed using an UV light), the light transmittance of the resin composition influences the curing reaction. Therefore, as inorganic porous material (c), it is advantageous to use an inorganic porous material having a refractive index which is similar to that of the photosensitive resin composition.

In the production of the laser engravable printing element from the photosensitive resin composition of the present invention, the photosensitive resin composition is crosslink-cured by irradiation thereof with light or electron beam. For promoting the crosslink-curing of the photosensitive resin composition, it is preferred that the photosensitive resin composition further comprises photopolymerization initiator (d). Photopolymerization initiator (d) can be appropriately selected from those which are customarily used. Examples of polymerization initiators usable as component (d) include a radical polymerization initiator, a cationic polymerization initiator and an anionic polymerization initiator which are exemplified in "Koubunshi Deta Handobukku—Kisohen (Polymer Data Handbook—Fundamentals)" edited by Polymer Society Japan, published in 1986 by Baifukan Co., Ltd., Japan. In the present invention, the crosslink-curing of the photosensitive resin composition which is performed by photopolymerization using a photopolymerization initiator is advantageous for improving the productivity of the printing element while maintaining the storage stability of the resin composition. Representative examples of conventional photopolymerization initiators which can be used as photopolymerization initiator (d) include benzoin; benzoin alkyl ethers, such as benzoin ethyl ether; acetophenones, such as 2-hydroxy-2-methyl-propiophenone, 4'-isopropyl-2-hydroxy-2-methylpropio-phenone, 2,2-dimethoxy-2-phenylacetophenone and di-ethoxy-acetophenone; photoradical initiators, such as 1-hydroxycyclohexyl phenyl ketone, 2-methyl-1-[4-(methyl-thio)phenyl]-2-morpholino-propane-1-one, methyl phenyl-glyoxylate, benzophenone, benzil, diacetyl, diphenyl-sulfide, eosin, thionine and anthraquinone; photo-cationic polymerization initiators, such as aromatic diazonium salt, an aromatic iodonium salt and an aromatic sulfonium salt, each of which generates an acid by absorbing light; and photopolymerization initiators, each of which generates a base by absorbing light. Photopolymerization initiator (d) is preferably used in an amount of from 0.01 to 10% by weight, based on the total weight of resin (a) and organic compound (b).

In addition, depending on the use and desired properties of the photosensitive resin composition, other additives, such as a polymerization inhibitor, an ultraviolet absorber, a dye, a pigment, a lubricant, a surfactant, a plasticizer and a fragrance, may be added to the photosensitive resin composition.

In another aspect of the present invention, there is provided a laser engravable printing element which is a cured photosensitive resin composition having a shape of a sheet or cylinder, wherein the laser engravable printing element contains an inorganic porous material. It is preferred that the laser engravable printing element of the present invention is a cured resin composition obtained by curing the photosensitive resin composition of the present invention.

The laser engravable printing element of the present invention is obtained by photocuring a photosensitive resin composition which comprises an inorganic porous material. Therefore, when the photosensitive resin composition of the present invention is used, a three-dimensionally crosslinked structure is formed by a reaction between the polymerizable unsaturated groups of resin (a) and the polymerizable unsaturated groups of organic compound (b), and the crosslinked resin composition becomes insoluble in the conventionally used solvents, such as esters, ketones, aromatic compounds, ethers, alcohols and halogenated solvents. The crosslinking reaction involves a reaction between resin (a) molecules, a reaction between organic compound (b) molecules, and/or a reaction between a resin (a) molecule and an organic compound (b) molecule, thus consuming the polymerizable unsaturated groups. With respect to the composition and structure of the laser engravable printing element of the present invention, the determinations thereof can be conducted as follows. When the resin composition is crosslink-cured using photopolymerization initiator (d), the photopolymerization initiator is decomposed with light. The unreacted photopolymerization initiator and the decomposition products thereof can be identified by extracting the crosslink-cured product with a solvent and analyzing the extracted product by GC-MS (a method in which products separated by gas chromatography are analyzed by mass spectroscopy), LC-MS (a method in which products separated by liquid chromatography are analyzed by mass spectroscopy), GPC-MS (a method in which products separated by gel permeation chromatography are analyzed by mass spectroscopy), LC-NMR (a method in which products separated by liquid chromatography are analyzed by nuclear magnetic resonance spectroscopy). Further, by the analysis of the above-mentioned extracted product by GPC-MS, LC-NMR or GPC-NMR, it is also possible to identify the unreacted resin (a), the unreacted organic compound (b) and relatively low molecular weight products formed by the reaction between the polymerizable unsaturated groups. With respect to a high molecular weight component which has a three-dimensionally crosslinked structure and is insoluble in a solvent, the thermal gravimetric GC-MS can be used to detect the structures which have been formed by the reaction between the polymerizable unsaturated groups and are present in the high molecular weight component. For example, the presence of a structure formed by a reaction between the polymerizable unsaturated groups of methacrylate groups, acrylate groups, styrene monomers and the like can be confirmed from the pattern of the mass spectrum. The thermal gravimetric GC-MS is a method in which a sample is decomposed by heat to thereby generate gas, and the generated gas is separated into components thereof by gas chromatography, followed by mass spectroscopic analysis of the separated components. When decomposed products derived from the photopolymerization initiator and unreacted photopolymerization initiator are detected in the crosslink-cured product together with the unreacted polymerizable unsaturated groups or structures formed by a reaction between the polymerizable unsaturated groups, it can be concluded that the analyzed product is one obtained by photo-curing a photosensitive resin composition.

The amount of the inorganic porous material contained in a crosslink-cured resin composition can be determined by heating a crosslink-cured resin composition in air, thereby burning the organic components away from the resin composition, and measuring the weight of the residual product. Further, whether or not the residual product is the inorganic porous material can be determined by observation of the shape of the residual product under a high resolution scanning electron microscope, measurement of the pore diameter distribution by means of a laser scattering particle size distribution analyzer, and measurements of the pore volume, pore size distribution and specific surface area by the nitrogen adsorption method.

The laser engravable printing element of the present invention is preferably a laser engravable printing element which is obtainable by a process comprising:

shaping the photosensitive resin composition of the present invention into a sheet or cylinder, and crosslink-curing the photosensitive resin composition by light or electron beam irradiation. It is more preferred that the laser engravable printing element of the present invention is one obtained by the above-mentioned process.

With respect to the method for shaping the photo-sensitive resin composition of the present invention into a sheet or cylinder, any of conventional methods employed for shaping resins can be employed. For example, there can be mentioned an injection molding method; a method in which a resin is extruded from a nozzle of a die by using a pump or extruder, followed by adjustment of the thickness of the extruded resin using a blade; and a method in which a resin is subjected to calendar processing using a roll, thereby obtaining a resin sheet having a desired thickness. During the shaping of the resin composition, the resin composition can be heated at a temperature which does not cause the lowering of the properties of the resin. Further, if desired, the shaped resin composition may be subjected to a treatment using a pressure roll or an abrasion treatment. In general, the resin composition is shaped on an underlay called "back film" which is made of PET (polyethylene terephthalate), nickel or the like. Alternatively, the resin composition can be shaped directly on a cylinder of a printing machine. In this case, a seamless sleeve can be formed. Further, the shaping of the resin composition can be performed by means of a sleeve-forming and engraving apparatus (which is an apparatus for coating a liquid photosensitive resin composition on a cylinder and irradiating the coated photosensitive resin composition with light to thereby cure and solidify the resin composition, wherein the apparatus is also equipped with a laser source for laser engraving). When such an apparatus is used, the laser engraving can be performed immediately after the formation of the sleeve, to thereby obtain a printing plate. Thus, a printing plate can be produced within an extremely short period of time as compared to the case of the production of a printing plate using a conventional rubber sleeve, where several weeks are needed.

The function of the above-mentioned "back film" is to impart dimensional stability to the printing element. Therefore, it is preferred to use a back film having a high dimensional stability. Preferred examples of materials for the back film include a metal, such as nickel, and a material having a coefficient of linear thermal expansion of not more than 100 ppm/° C., more preferably not more than 70 ppm/° C. Specific examples of materials for the back film include a polyester resin, a polyimide resin, a polyamide resin, a polyamideimide resin, a polyetherimide resin, a poly-bis- maleimide resin, a polysulfone resin, a polycarbonate resin, a polyphenylene ether resin, a polyphenylene thioether resin, a polyethersulfone resin, a liquid crystal resin composed of a wholly aromatic polyester resin, a wholly aromatic polyamide resin and an epoxy resin. Of these resins, a plurality of different resins may be used to produce a back film which is a laminate of layers of different resins. For example, a sheet formed by laminating a 50 μm-thick polyethylene terephthalate sheet on each side of a 4.5 μm-thick wholly aromatic polyamide film can be used. In addition, a porous sheet, such as a cloth obtained by weaving a fiber, a nonwoven fabric, or a porous film obtained by forming pores in a film, can be also used as a back film. When a porous sheet is used as a back film, the pores of the porous film can be impregnated with a liquid photosensitive resin composition, followed by photocuring of the resin composition, to thereby unifying the cured resin layer with the back film and achieve a strong adhesion between the cured resin layer and the back film. Examples of fibers which can be used to form a cloth or nonwoven fabric include inorganic fibers, such as a glass fiber, an alumina fiber, a carbon fiber, an alumina-silica fiber, a boron fiber, a high silicon fiber, a potassium titanate fiber and a sapphire fiber; natural fibers, such as cotton and linen; semisynthetic fibers, such as a rayon, an acetate and a promix; and synthetic fibers, such as a nylon fiber, a polyester fiber, an acryl fiber, a vinylon fiber, a polyvinyl chloride fiber, a polyolefin fiber, a polyurethane fiber, a polyimide fiber and an aramid fiber. Cellulose produced by bacteria is a highly crystalline nanofiber, and it can also be used to produce a thin nonwoven fabric having a high dimensional stability.

As a method for decreasing the coefficient of linear thermal expansion of the back film, there can be mentioned a method in which a filler is added to the back film, and a method in which a meshed cloth of an aromatic polyamide, a glass cloth or the like is impregnated or coated with a resin. The fillers added to the back film can be conventional fillers, such as organic microparticles, inorganic microparticles of metal oxides or metals, and organic-inorganic composite microparticles. Further, the fillers can be porous microparticles, hollow microparticles, capsulate microparticles or particles of compounds having a lamellar structure in which a low molecular weight compound is intercalated. Especially useful are microparticles of metal oxides, such as alumina, silica, titanium oxide and zeolite; latex microparticles formed of a polystyrene-polybutadiene copolymer; highly crystalline cellulose; and natural organic microparticles and fibers, such as a highly crystalline cellulose nanofiber produced by an organism.

The back film used in the present invention may be subjected to a physical treatment or chemical treatment so as to improve the adhesion of the back film to the photosensitive resin composition layer or the adhesive agent layer. With respect to the physical treatment, there can be mentioned a sand blast method, a wet blast method (in which a liquid suspension of microparticles is sprayed), a corona discharge treatment, a plasma treatment and an UV light irradiation or vacuum UV light irradiation. With respect to the chemical treatment, there can be mentioned a treatment with a strong acid or strong alkali, an oxidation agent or a coupling agent.

The thus obtained shaped photosensitive resin composition is crosslink-cured by light or electron beam irradiation to obtain a printing element. The photosensitive resin composition can also be crosslink-cured by light or electron beam irradiation while shaping the photosensitive resin composition. Alternatively, the crosslink-curing of the resin composition can be performed by heating instead of light or electron beam irradiation. However, it is preferred to perform the crosslink-curing with light since a simple apparatus can be used, and a printing element having a uniform thickness can be obtained. With respect to the light source used for curing, there can be mentioned a high pressure mercury lamp, an ultra-high pressure mercury lamp, an ultraviolet fluorescent lamp, a carbon arc lamp and a xenon lamp. The curing of the resin composition can be also performed by any other conventional methods for curing a resin composition. The photo-curing can be performed by irradiating lights of different light sources in combination.

The thickness of the laser engravable printing element of the present invention can be appropriately selected depending on the use of the printing element. When the printing element is used for producing a printing plate, the thickness of the printing element is generally in the range of from 0.1 to 15 mm. Further, the printing element can be a multi-layered printing element comprising a plurality of layers made of different materials.

Accordingly, in still another aspect of the present invention, there is provided a multi-layered, laser engravable printing element comprising a printing element layer and at least one elastomer layer provided below the printing element layer. The multi-layered, laser engravable printing element of the present invention comprises a printing element layer which is made of the above-mentioned printing element of the present invention, and at least one elastomer layer provided below the printing element layer. In general, the depth of the laser engraving in the printing element layer (that is, the thickness of the portion which is removed by laser engraving) is 0.05 mm to several millimeters. The portion of the printing element under the engraved portion can be made of a material other than the photosensitive resin composition of the present invention. The above-mentioned elastomer layer which functions as a cushion layer has a Shore A hardness of from 20 to 70, preferably from 30 to 60. When the Shore A hardness of the elastomer layer is in the above-mentioned range, the elastomer layer is capable of changing its shape appropriately so as to maintain the printing quality of the printing plate. When the Shore A hardness exceeds 70, such an elastomer layer is incapable of functioning as a cushion layer.

There is no particular limitation with respect to an elastomer used as a raw material for the elastomer layer so long as the elastomer has rubber elasticity. The elastomer layer may contain components other than an elastomer so long as the elastomer layer has a Shore A hardness in the above-mentioned range. As elastomers usable as raw materials for the elastomer layer, there can be mentioned a thermoplastic elastomer, a photocurable elastomer, a thermocurable elastomer and a porous elastomer having micropores having a size of nanometer level. From the viewpoint of ease in producing a printing plate having a shape of a sheet or cylinder, it is preferred that the elastomer layer is produced by photocuring a resin which is in a liquid state at room temperature (that is, a raw material which becomes an elastomer after being photocured).

Specific examples of thermoplastic elastomers used for producing the cushion layer include styrene thermoplastic elastomers, such as SBS (polystyrene-polybutadiene-polystyrene), SIS (polystyrene-polyisoprene -polystyrene) and SEBS (polystyrene-polyethylene/polybutyrene-polystyrene); olefin thermoplastic elastomers; urethane thermoplastic elastomers; ester thermoplastic elastomers; and amide thermoplastic elastomers.

As the photocurable elastomers, there can be mentioned a mixture obtained by mixing the above-mentioned thermoplastic elastomer with a photopolymerizable monomer, a plasticizer, a photopolymerization initiator and the like; and a liquid composition obtained by mixing a plastomer resin with a photopolymerizable monomer, a photopolymerization initiator and the like.

In the present invention, differing from the production of a printing plate using a conventional printing plate, in which a precise mask image should be formed on the printing element using light, the resin composition is cured by exposing the whole surface of the shaped article of the resin composition to light and, thus, it is not necessary to use a material having properties which are conventionally needed to form precise pattern on the printing element. Therefore, so long as the resin composition exhibits a satisfactory level of mechanical strength, there is a freedom of choice with respect to the raw materials used for producing the resin composition.

In addition to the elastomers mentioned above, it is also possible to use vulcanized rubbers, organic peroxides, primary condensates of phenolic resin, quinone dioxime, metal oxides and non-vulcanized rubbers, such as thiourea. Further, it is also possible to use an elastomer obtained by three dimensionally crosslinking a telechelic liquid rubber by using a curing agent therefor.

There is no particular limitation with respect to the thickness of the elastomer layer, but it is generally in the range of from 0.05 mm to 10 mm. With respect to the number of the elastomer layers, there is no particular limitation, but it is generally one or two. For example, first elastomer layer having high resistance to ink can be provided below the printing element layer, and second elastomer layer having a lower resistance to ink but having a higher cushioning properties can be provided below the first elastomer layer. In the production of a multi-layered printing element, a back film can be formed either below the elastomer layer or in between the printing element layer and the elastomer layer.

In addition, a modifier layer can be provided on the surface of the laser engravable printing element of the present invention to thereby decrease the surface tack and improve the ink wettability of the printing plate. Examples of modifier layers include a coating formed by a surface treatment with a compound, such as a silane coupling agent and a titanium coupling agent, which reacts with hydroxyl groups present on the surface of the printing element; and a polymer film containing porous inorganic particles.

Widely used silane coupling agent is a compound having in the molecule thereof a functional group which is highly reactive with hydroxyl groups present on the surface of a substrate. Examples of such functional groups include a trimethoxysilyl group, a triethoxysilyl group, a trichlorosilyl group, a diethoxysilyl group, a dimethoxysilyl group, a dimonochlorosilyl group, a monoethoxysilyl group, a monomethoxysilyl group and a monochlorosilyl group. At least one of these functional groups is present in each molecule of the silane coupling agent and the molecule is immobilized on the surface of a substrate by the reaction between the functional group and the hydroxyl groups present on the surface of the substrate. Further, the silane coupling agent used in the present invention may contain a compound having in the molecule thereof at least one functional group selected from the group consisting of an acryloyl group, a methacryloyl group, an amino group containing an active hydrogen, an epoxy group, a vinyl group, a perfluoroalkyl group and a mercapto group, and/or a compound having a long chain alkyl group as a reactive functional group.

Examples of titanium coupling agents include isopropyltriisostearoyl titanate, isopropyltris(dioctylpyrophosphate) titanate, isopropyltri(N-aminoethyl-aminoethyl) titanate, tetraoctylbis(di-tridecyl-phosphite) titanate, tetra(2,2-diallyloxymethyl-1-butyl)bis(di-tridecyl)phosphite titanate, bis(octyl-pyrophosphate)oxyacetate titanate, bis(dioctylpyrophosphate)ethylene titanate, isopropyltrioctanoyl titanate, isoproyldimethacrylisostearoyl titanate, isopropyltridodecylbenzenesulfonyl titanate, isopropylisostearoyldiacryl titanate, isopropyltri(dioctylsulfate) titanate, isopropyltricumylphenyl titanate and tetraisopropylbis(dioctylphosphite) titanate.

When the coupling agent molecule which is immobilized on the surface of the printing plate has a polymerizable reactive group, after the immobilization of the coupling agent, the coupling agent may be cross-linked by irradiation with light, heat or electron beam to thereby form a stronger coating.

Hereinbelow, explanations are made on the methods for performing a coupling agent treatment. If desired, the above-mentioned coupling agent may be diluted with a mixture of water and alcohol or a mixture of aqueous acetic acid and alcohol, to thereby obtain a coupling agent solution. The concentration of the coupling agent in the solution is preferably 0.05 to 10.0% by weight. The coupling agent solution is applied to the surface of the printing element or the printing plate after laser engraving, to thereby form a coating. There is no particular limitation with respect to the method for applying the coupling agent solution. For example, the application of the coupling agent solution may be performed by an immersing method, a spraying method, a roll coating method or a coating method using a brush. There is no particular limitation with respect to the coating temperature and the coating time, but it is preferred that the coating is performed at 5 to 60° C. for 0.1 to 60 seconds. It is preferred that the drying of the coupling agent solution layer formed on the surface of the printing element or the printing plate is performed by heating, and the preferred heating temperature is 50 to 150° C.

Before treating the surface of the printing element or printing plate with a coupling agent, the surface of the printing element or printing plate may be irradiated with a xenon excimer lamp (that is, vacuum ultraviolet light which has a wavelength of not more than 200 nm) or exposed to a high energy atmosphere (such as plasma), to thereby generate hydroxyl groups on the surface of the printing element or printing plate and immobilize the coupling agent at high density on the surface of the printing element or printing plate.

When a printing element layer containing the particulate inorganic porous material is exposed at the surface of a printing plate, such a printing plate may be treated under a high energy atmosphere, such as plasma, so as to etch the surface resin composition layer slightly, thus forming minute concave-convex portions on the surface. This treatment may decrease the surface tack and improve the ink wettability of the printing plate because the treatment enables the particulate inorganic porous material to absorb ink more easily.

In a laser engraving process, a desired image is converted into digital data, and a relief pattern (corresponding to the desired image) is formed on the printing element by controlling a laser irradiation apparatus by a computer having the above-mentioned digital data. The laser used for the laser engraving may be any type of laser so long as the laser comprises a light having a wavelength which can be absorbed by the printing element. For performing the laser engraving quickly, it is preferred that the output of the laser is as high as possible. Specifically, lasers having an oscillation in an infrared or near-infrared range, such as a carbon dioxide laser, a YAG laser, a semiconductor laser and a fiber laser, are preferred. Further, ultraviolet lasers having an oscillation in a ultraviolet light range, such an excimer laser, a YAG laser tuned to the third or fourth harmonics and a copper vapor laser, may be used for an abrasion treatment (which breaks the linkages in the organic compounds) and hence, are suitable for forming precise patterns. In addition, it is also possible to use lasers having a very high spinodal output, such as a femtosecond laser. The laser irradiation may be either a continuous irradiation or a pulse irradiation. In general, a resin absorbs a light having a wavelength around 10 μm. Therefore, when a carbon dioxide laser having an oscillation wavelength around 10 μm is used, there is no need to add a component for facilitating the absorption of the laser beam. However, when a YAG laser, a semiconductor laser, a fiber laser and the like which have an oscillation wavelength around 1 μm are used, since most organic compounds do not absorb light having a wavelength around 1 μm, it is necessary to add a component, such as a dye or a pigment, for facilitating the absorption of a laser beam. Examples of such dyes include a poly(substituted)-phthalocyanine compound and a metal-containing phthalocyanine compound, a cyanine compound, a squalilium dye, a chalcogenopyryloallylidene dye, a chloronium dye, a metal thiolate dye, a bis(chalcogenopyrylo)polymethene dye, an oxyindolidene dye, a bis(aminoaryl)polymethene dye, melocyanine dye and a quinoid dye. Examples of pigments include dark colored inorganic pigments, such as carbon black, graphite, copper chromite, chromium oxide, cobalt chromium aluminate and iron oxide; metal powders, such as iron, aluminum, copper and zinc, and doped metal powders which are obtained by doping any of the above-mentioned metal powders with Si, Mg, P, Co, Ni, Y or the like. These dyes and pigments can be used individually or in combination. When a plurality of different dyes or pigments is used in combination, they can be combined in any form. For example, different dyes or pigments may be used in such a form as having a laminate structure. However, when a photosensitive resin composition is cured by irradiation with ultraviolet or visible light, for curing the printing element from the outer portion thereof through the inner portion thereof, it is preferred to avoid the use of a pigment and dye which absorb light having the same wavelength as that of light used for the curing of the resin composition. The curing properties of a resin composition are influenced greatly by the type of the photopolymerization initiator used, but the amount of a dye and/or pigment added to the photosensitive resin composition is preferably not more than 1% by weight, more preferably not more than 0.2% by weight, based on the weight of the resin composition.

The laser engraving is performed in an atmosphere of oxygen-containing gas, generally in the presence of or under the flow of air; however, it can be also performed in an atmosphere of carbon dioxide gas or nitrogen gas. After completion of the laser engraving, powdery or liquid debris generated in a small amount on the surface of the resultant relief printing plate may be removed by an appropriate method, such as washing with a water containing a solvent or surfactant, high pressure spraying of an aqueous detergent or spraying of a high pressure steam.

The printing element of the present invention can be advantageously used not only for forming a relief pattern of a printing plate, but also for the production of a stamp and seal; a design roll for embossing; a relief pattern for patterning a paste or ink used for producing an electronic circuit, such as an insulating material, a resistive material, a conductive material and a semiconductive material (including an organic semiconductive material); a relief pattern for mold used for producing potteries; a relief pattern for display in an advertisement or indicator; and molds for various molded articles.

BEST MODE FOR CARRYING OUT THE INVENTION

Hereinbelow, the present invention will be described in more detail with reference to the following Examples and Comparative Examples, but they should not be construed as limiting the scope of the present invention.

Resins having a polymerizable unsaturated group, which are used in the Examples and the Comparative Examples, were synthesized in the following Reference Examples.

With respect to each of the polymerizable unsaturated group-containing resins produced in the Reference Examples, the number average molecular weight and average number of the polymerizable unsaturated group per molecule were determined by the following methods.

Number average molecular weight: The number average molecular weight of a resin was measured by means of a high performance GPC apparatus (HLC-8020; manufactured and sold by Tosoh Corporation, Japan) and a polystyrene packed column (tradename: TSKgel GMHXL; manufactured and sold by Tosoh Corporation, Japan) wherein tetrahydrofuran (THF) was used as a carrier. The column temperature was maintained at 40° C. A THF solution containing 1% by weight of a resin was used as a sample and 10 µl of the sample was charged to the GPC apparatus. A UV absorption detector was used as a detector and a light having a wavelength of 254 nm was used as a monitoring light.

Average number of polymerizable unsaturated group per molecule:

In each of the Reference Examples, an intermediate resin product having two terminal hydroxyl groups (e.g., a resin product produced by reacting a diol compound and tolylene diisocyanante) was provided and, then, a final resin product having a methacryl group as a polymerizable unsaturated group was produced, for example, by adding 2-methacryloyloxyisocyanate to the intermediate resin product, to thereby react the terminal hydroxyl groups of the intermediate resin product with an isocyanate group of 2-methacryloyloxyisocyanate. In order to measure the number of the Ipolymerizable unsaturated group per molecule of the final resin product, the above-mentioned intermediate resin product and final resin product was individually dissolved in a deuterated chloroform, and the resultant solutions were analyzed by NMR spectroscopy. The NMR spectroscopy was performed using α500 type NMR apparatus (detection frequency: 500 MHz) (manufactured and sold by JEOL Ltd., Japan). The molecular structures of the intermediate resin product and final resin product were determined by analyzing the NNR spectrum. Specifically, the unreacted hydroxyl group and methacryl group of the final resin product were identified, and the molar ratio (R) of the unreacted hydroxyl group to the methacryl group was calculated from the signal integral ratio of the NMR spectrum. Using the thus obtained R value, the average number of the polymerizable unsaturated group per molecule was calculated.

Further, in each of Reference Examples 1 to 9, the change in the amount of the isocyanate group (i.e., isocyanate group of the reaction product of a reaction between a polyol and a diisocyanate in each of Reference Examples 1, 2 and 4, or isocyanate group of 2-methacryloyloxyisocyanate in each of Reference Examples 3, and 5 to 9) was monitored by means of a FT-IR (1640 type infrared Foulier transform spectrometer) (manufactured and sold by Perkin Elmer Inc., U.S.A.) to thereby determine the reaction time for producing the final resin product.

REFERENCE EXAMPLE 1

To a separable flask (which had a capacity of 1 liter and was equipped with a thermometer, a stirrer and a reflux condenser) were added 500 g of polytetramethylene glycol (Mn: 1,830, OH value: 61.3) (manufactured and sold by Asahi Kasei Kabushiki Kaisha, Japan) and 52.40 g of tolylene diisocyanate, and the resultant mixture was heated at 60° C. for approximately 3 hours to perform a reaction, thereby obtaining a reaction mixture. Subsequently, 25.24 g of 2-hydroxypropyl methacrylate and 31.75 g of polypropylene glycol monomethacrylate (Mn: 400) were added to the obtained reaction mixture, and the reaction was further continued for 2 hours, thereby obtaining resin (I) having a terminal methacryl group (the average number of methacryl group (polymerizable unsaturated group) per molecule was approximately 2) and having a number average molecular weight of approximately 20,000. Resin (I) was a viscous fluid at 20° C. and it was a plastomer which changes a shape thereof in accordance with a force applied thereto and does not recover the original shape thereof after released from the force.

REFERENCE EXAMPLE 2

To a separable flask (which had a capacity of 1 liter and was equipped with a thermometer, a stirrer and a reflux condenser) were added 500 g of polycarbonate diol (tradename: Kuraray Polyol C-2015N; manufactured and sold by Kuraray Co., Ltd., Japan) (Mn: 2,000, OH value: 56.0) and 49.86 g of tolylene diisocyanate, and the resultant mixture was heated at 60° C. for approximately 3 hours to perform a reaction, thereby obtaining a reaction mixture. Subsequently, 26.63 g of 2-hydroxypropyl methacrylate and 35.27 g of polypropylene glycol monomethacrylate were added to the obtained reaction mixture, and the reaction was further continued for 2 hours, thereby obtaining resin (II) having a terminal methacryl group (the average number of methacryl group (polymerizable unsaturated group) per molecule was approximately 2) and having a number average molecular weight of approximately 15,000. Resin (II) was a viscous fluid at 20° C. and it was a plastomer which changes a shape thereof in accordance with a force applied thereto and does not recover the original shape thereof after released from the force.

REFERENCE EXAMPLE 3

To a separable flask (which had a capacity of 1 liter and was equipped with a thermometer, a stirrer and a reflux condenser) were added 500 g of polyisoprene polyol (tradename: LIR-506; manufactured and sold by Kuraray Co., Ltd., Japan) (Mn: 16,400, OH value: 17.1) and 23.65 g of 2-methacryloyloxyisocyanate, and the resultant mixture was heated at 60° C. for 7 hours to perform a reaction, thereby obtaining resin (III) having a terminal methacryl group (the average number of methacryl group (polymerizable unsaturated group) per molecule was approximately 5) and having a number average molecular weight of approximately 17,200. Resin (III) was a viscous fluid at 20° C. and it was a plastomer which changes a shape thereof in accordance with a force applied thereto and does not recover the original shape thereof after released from the force.

REFERENCE EXAMPLE 4

To a separable flask (which had a capacity of 1 liter was equipped with a thermometer, a stirrer and a reflux condenser) were added 500 g of polytetramethylene glycol (Mn: 1,830, OH value: 61.3) (manufactured and sold by Asahi Kasei Kabushiki Kaisha, Japan) and 52.40 g of tolylene diisocyanate, and the resultant mixture was heated at 60° C. for approximately 3 hours to perform a reaction, thereby obtaining a reaction mixture. Subsequently, 6.2 g of 2-hydroxypropyl methacrylate and 7.9 g of polypropylene glycol monomethacrylate (Mn: 400) were added to the obtained reaction mixture, and the reaction was further continued for 2 hours, followed by addition of 20 g of ethanol. The reaction was continued for 2 hours to thereby obtain resin (IV) having a terminal methacryl group (the average number of polymerizable unsaturated group (methacryl group) per molecule was approximately 0.5) and having a number average molecular weight of approximately 20,000. Resin (IV) was a viscous fluid at 20° C. and it was a plastomer which changes a shape thereof in accordance with a force applied thereto and does not recover the original shape thereof after released from the force.

REFERENCE EXAMPLE 5

To a separable flask (which had a capacity of 1 liter and was equipped with a thermometer, a stirrer and a reflux condenser) were added 447.24 g of polycarbonate diol (tradename: PCDL L4672; manufactured and sold by Asahi Kasei Kabushiki Kaisha, Japan) (Mn: 1,990, OH value: 56.4) and 30.83 g of tolylene diisocyanate, and the resultant mixture was heated at 80° C. for approximately 3 hours to perform a reaction, thereby obtaining a reaction mixture. Subsequently, 14.83 g of 2-methacryloyloxyisocyanate was added to the obtained reaction mixture, and the reaction was further continued for approximately 3 hours, thereby obtaining resin (V) having a terminal methacryl group (the average number of polymerizable unsaturated group (methacryl group) per molecule was approximately 2) and having a number average molecular weight of approximately 10,000. Resin (V) was a viscous fluid at 20° C. and it was a plastomer which changes a shape thereof in accordance with a force applied thereto and does not recover the original shape thereof after released from the force.

REFERENCE EXAMPLE 6

To a separable flask (which had a capacity of 1 liter was equipped with a thermometer, a stirrer and a reflux condenser) were added 447.24 g of polycarbonate diol (tradename: PCDL L4672) (manufactured and sold by Asahi Kasei Kabushiki Kaisha, Japan) (Mn: 1,990, OH value: 56.4) and 30.83 g of tolylene diisocyanante, and the resultant mixture was heated at 80° C. for approximately 3 hours to perform a reaction, thereby obtaining a reaction mixture. Subsequently, 7.42 g of 2-methacryoyloxyisocyanate was added to the obtained reaction mixture, and the reaction was continued for approximately 3 hours, thereby obtaining resin (VI) having a terminal methacryl group (the average number of polymerizable unsaturated group (methacryl group) per molecule was approximately 1) and having a number average molecular weight of approximately 10,000. Resin (VI) was a viscous fluid at 20° C. and it was a plastomer which changes a shape thereof in accordance with a force applied thereto and does not recover the original shape thereof after released from the force.

REFERENCE EXAMPLE 7

To a separable flask (which had a capacity of 1 liter and was equipped with a thermometer, a stirrer and a reflux condenser) were added 449.33 g of polycarbonate diol (tradename: PCDL L4672; manufactured and sold by Asahi Kasei Kabushiki Kaisha, Japan) (Mn: 1,990, OH value: 56.4) and 12.53 g of tolylene diisocyanante, and the resultant mixture was heated at 80° C. for approximately 3 hours to perform a reaction, thereby obtaining a reaction mixture. Subsequently, 47.77 g of 2-methacryoyloxyisocyanate was added to the obtained reaction mixture, and the reaction was further continued for approximately 3 hours, thereby obtaining resin (VII) having a terminal methacryl group (the average number of polymerizable unsaturated group (methacryl group) per molecule was approximately 2) and having a number average molecular weight of approximately 3,000. Resin (VII) was a viscous fluid at 20° C. and it was a plastomer which changes a shape thereof in accordance with a force applied thereto and does not recover the original shape thereof after released from the force.

REFERENCE EXAMPLE 8

To a separable flask (which had a capacity of 1 liter and was equipped with a thermometer, a stirrer and a reflux condenser) were added 449.33 g of polycarbonate diol (tradename: PCDL L4672; manufactured and sold by Asahi Kasei Kabushiki Kaisha, Japan) (Mn: 1,990, OH value: 56.4) and 12.53 g of tolylene diisocyanante, and the resultant mixture was heated at 80° C. for approximately 3 hours to perform a reaction, thereby obtaining a reaction mixture. Subsequently, 23.89 g of 2-methacryloyloxyisocyanate was added to the reaction mixture, and the reaction was further continued for approximately 3 hours, thereby obtaining resin (VIII) having a terminal methacryl group (the average number of polymerizable unsaturated group (methacryl group) per molecule was approximately 1) and having a number average molecular weight of approximately 3,000. Resin (VIII) was a viscous fluid at 20° C. and it was a plastomer which changes a shape thereof in accordance with a force applied thereto and does not recover the original shape thereof after released from the force.

REFERENCE EXAMPLE 9

A separable flask (which had a capacity of 1 liter and was equipped with a thermometer, a stirrer and a reflux condenser) were added 500.00 g of tripropylene glycol (Mn: 192) (manufactured and sold by Tokyo Kasei Kogyo Co., Ltd., Japan) and 283.52 g of tolylene diisocyanante, and the resultant mixture was heated at 80° C. for approximately 3 hours to perform a reaction, thereby obtaining a reaction mixture. Subsequently, 75.98 g of 2-methacryloyloxyisocyanate was added to the reaction mixture, and the reaction was further continued for approximately 3 hours to thereby obtain resin (IX) having a terminal methacryl group (the average number of polymerizable unsaturated group (methacryl group) per molecule was approximately 0.5) and having a number average molecular weight of approximately 800. Resin (IX) was a viscous fluid at 20° C. and it was a plastomer which changes a shape thereof in accordance with a force applied thereto and does not recover the original shape thereof after released from the force.

In the following Examples and Comparative Examples, properties of a photosensitive resin composition were evaluated and measured as follows.

(1) Laser Engraving

Laser engraving was performed by means of a carbon dioxide laser engraving apparatus (tradename: TYP STAMPLAS SN 09; manufactured and sold by Baasel Lasertech, Germany). The laser engraved pattern included portions corresponding to halftone dots (screen ruling=80 lpi (lines per inch), and total area of halftone dots=approximately 10%, based on the halftone area of a print obtained using the engraved pattern), 500 µm-wide relief lines (convex lines) and 500 µm-wide reverse lines (grooves). When the laser engraving is performed so that the engraving depth becomes large, a problem arises wherein a satisfactorily large area of the top portion of a precise halftone relief pattern cannot be obtained, so that the destruction of the portions corresponding to halftone dots occurs and the printed dots become unclear. For preventing this problem, the laser engraving was performed with the engraving depth of 0.55 mm.

(2) Amount of Wiping Needed to Remove the Debris and the Relative Amount of the Residual Debris Debris on the printing element after laser engraving was wiped away with a nonwoven fabric (tradename: BEMCOT M-3; manufactured and sold by Asahi Kasei Kabushiki Kaisha, Japan) which was impregnated with ethanol or acetone. The amount of wiping needed to remove the debris was defined as the number of times the wiping was performed to remove the viscous liquid debris generated during the laser engraving. A large amount of wiping means that a large amount of liquid debris was formed on the printing plate. It is preferred that the amount of wiping needed to remove the debris is not more than 5 times, more advantageously not more than 3 times.

Further, the weight of a printing element before laser engraving, the weight of the printing element immediately after the laser engraving and the weight of a relief printing plate after wiping were measured. The relative amount of the residual debris was calculated in accordance with the following formula:

$$\frac{\text{(Weight of a printing element immediately after laser engraving)} - \text{(Weight of a relief printing plate after wiping)}}{\text{(Weight of a printing element before laser engraving)} - \text{(Weight of a relief printing plate after wiping)}} \times 100$$

It is advantageous when a printing plate has the residual debris in an amount of not more than 15% by weight, preferably not more than 10% by weight.

(3) Tack on the Surface of a Relief Printing Plate

Tack on the surface of a relief printing plate after wiping was measured by means of a tack tester (manufactured and sold by Toyo Seiki Seisaku-Sho Ltd., Japan). Specifically, an aluminum ring having a radius of 50 mm and a width of 13 mm was attached to a smooth portion of a relief printing plate (test specimen) at 20° C. so that the aluminum ring stood vertically on the specimen. A load of 0.5 kg was applied to the aluminum ring for 4 seconds. Subsequently, the aluminum ring was pulled at a rate of 30 mm per minute and the resisting force at the time of the detachment of the aluminum ring was measured by means of a push-pull gauge. The larger the resisting force, the larger the surface tack (tackiness) and the adhesive strength of the specimen. It is advantageous when the surface tack of a printing plate is not more than 150 N/m, preferably not more than 100 N/m.

(4) Evaluation of Portions of a Relief Pattern Which Correspond to Halftone Dots With respect to the laser engraved printing plate (having a relief pattern formed thereon) obtained by the method of item (1) above, the portions of the relief pattern which correspond to the halftone dots (screen ruling=80 lpi (lines per inch), and total area of halftone dots=approximately 10%, based on the halftone area of a print obtained using the engraved pattern) were observed under an electron microscope with a magnification of 200 to 500. It is advantageous when the portions of the relief pattern which correspond to the halftone dots have a cone shape or cone-like shape (i.e., truncated cone in which the apex of a cone is removed so that the plane at the top portion of the resultant cone is parallel to the base of the cone).

(5) Pore Volume, Average Pore Diameter and Specific Surface Area of a Porous or Non-Porous Material 2 g of a porous or non-porous material as a sample was placed in a test tube and vacuum-dried for 12 hours by means of a pretreatment apparatus at 150° C. under 1.3 Pa or less. The pore volume, average pore diameter and specific surface area of the dried porous or non-porous material were measured by means of "Autosorb-3MP" (manufactured and sold by Quantachrome Instruments, U.S.A.), wherein nitrogen gas was adsorbed on the porous or non-porous material in an atmosphere cooled by liquid nitrogen. Specifically, the specific surface area was calculated by the BET formula. With respect to the pore volume and average pore diameter, a cylindrical model was postulated from the adsorption isotherm during the elution of nitrogen, and the pore volume and average pore diameter were calculated by the BJH (Brrett-Joyner-Halenda) method which is a conventional method for analyzing pore distribution.

(6) Ignition Loss of the Porous or Non-Porous Material

The weight of a sample of a porous or nonporous material was measured and recorded. Subsequently, the sample was heated using a high temperature electric furnace (FG31 type; manufactured and sold by Yamato Scientific Co., Ltd., Japan) in air at 950° C. for 2 hours. The difference in the weight of the sample as between before and after the heating was defined as the ignition loss.

(7) Viscosity

The viscosity of a resin composition was measured by means of a B type viscometer (B8H type; manufactured and sold by Kabushiki Kaisha Tokyo Keiki, Japan) at 20° C.

EXAMPLES 1 TO 9 AND COMPARATIVE EXAMPLES 1 TO 4

In Examples 1 to 9 and Comparative Examples 1 to 4, resin compositions having formulations shown in Table 1 were produced as follows. In Examples 1 to 9 and Comparative Examples 1 to 4, resins (I) to (IX) (which were, respectively, produced in Reference Examples 1 to 9) and a styrene-butadiene copolymer (hereinafter, referred to as "SBS") (tradename: Tufprene A; manufactured and sold by Asahi Kasei Kabushiki Kaisha, Japan) were used as resin (a); the acrylic esters shown in Table 1 were used as organic compound (b); and inorganic porous material (c), photopolymerization initiator (d) and other additives which are shown in Table 1 were used. In each of Examples 1 to 9 and Comparative Examples 1 to 4, in accordance with the formulation shown in Table 1, all of the components were charged into a separable flask equipped with agitating blades and a motor (tradename: Three One Motor), and the resultant mixture were agitated at 80° C. in the presence of air. The resultant mixture was cooled to 40° C. and allowed to stand still at 40° C. to thereby deaerate the mixture and obtain a resin composition. The characteristics of organic compound (b) used in the Examples and the Comparative Examples are shown in Table 2. As inorganic porous material (c), the following porous microparticulate silica products (each manufactured and sold by Fuji Silysia Chemical Ltd., Japan) were used:

C-1504 (tradename: SYLOSPHERE C-1504) (number average particle diameter: 4.5 µm, specific surface area: 520 $m^2$/g, average pore diameter: 12 nm, pore volume: 1.5 ml/g, ignition loss: 2.5% by weight, oil absorption: 290 ml/100 g, and specific porosity (defined above): 780);

CH-4004 (tradename: SYLOPHOBIC 4004) (number average particle diameter: 8.0 µm, specific surface area: 300 $m^2$/g, average pore diameter: 17 nm, pore volume: 1.25 ml/g, ignition loss: 5.0% by weight, oil absorption: 200 ml/100 g and specific porosity: 800); and C-470 (tradename: SYLYSIA 470) (number average particle diameter: 14.1 µm, specific surface area: 300 $m^2$/g, average pore diameter: 17 nm, pore volume: 1.25 ml/g, ignition loss: 5.0% by weight, oil absorption: 180 ml/100 g and specific porosity: 1410).

(The above-mentioned values of average pore diameter and oil absorption are those described in the manufacturer's catalog. Other values were obtained by the measurements conducted by the present inventors. The specific porosity was calculated by the above-mentioned method using the density (2 $g/cm^3$) of each of the porous materials.)

The obtained resin composition was shaped into a sheet (thickness: 2.8 mm) on a PET (polyethylene terephthalate) film. The shaped resin article was photo-cured by means of ALF type 213E exposure apparatus (manufactured and sold by Asahi Kasei Kabushiki Kaisha, Japan) and an ultraviolet low pressure mercury lamp ("FLR20S-B-DU-37C/M"; manufactured and sold by Toshiba Corporation, Japan) (emission wavelength: 350 to 400 nm, peak wavelength: 370 nm). The exposure was performed for 10 minutes in vacuo, in which the upper surface of the sheet (on which a relief pattern was to be formed) was exposed at 1000 mJ/$cm^2$ and the other surface of the sheet was exposed at 500 mJ/$cm^2$, thereby obtaining a printing element.

A relief pattern was engraved on the obtained printing element by means of a carbon dioxide laser engraving apparatus, thereby obtaining a relief printing plate, and the obtained relief printing plate was evaluated. The results are shown in Table 3.

Further, each of the resin compositions produced in the Examples and the Comparative Examples was a liquid resin composition capable of plastic deformation at 20° C., namely a plastomer. The viscosities of the photosensitive resin compositions at 20° C. are shown in Table 4.

TABLE 1

| | Resin (a) | | Organic compound (b) | | Compound having an alicyclic functional group or an aromatic functional group[2] | Inorganic porous material (c) | | Polymerization initiator (d)[3] | | Other additives[4] | |
|---|---|---|---|---|---|---|---|---|---|---|---|
| | Type | Amount[1] | Type | Amount[1] | | Type | Amount[1] | Type | Amount[1] | Type | Amount[1] |
| Ex. 1 | (I) | 100 | LMA | 6 | none | C-1504 | 5 | DMPAP | 0.6 | BHT | 0.5 |
| | | | PPMA | 15 | | | | | | | |
| | | | DEEHEA | 25 | | | | | | | |
| | | | TEGDMA | 2 | | | | | | | |
| | | | TMPTMA | 2 | | | | | | | |
| Comp. Ex. 1 | (II) | 100 | LMA | 6 | none | None | | " | | BHT | 0.5 |
| | | | PPMA | 15 | | | | | | | |
| | | | DEEHEA | 25 | | | | | | | |
| | | | TEGDMA | 2 | | | | | | | |
| | | | TMPTMA | 2 | | | | | | | |
| Ex. 2 | (II) | 100 | LMA | 6 | none | C-1504 | 5 | " | | " | " |
| | | | PPMA | 15 | | | | | | LB | 5 |
| | | | DEEHEA | 25 | | | | | | | |
| | | | TEGDMA | 2 | | | | | | | |
| | | | TMPTMA | 2 | | | | | | | |
| Ex. 3 | (III) | 100 | LMA | 6 | none | " | " | " | " | BHT | 0.5 |
| | | | PPMA | 15 | | | | | | | |
| | | | DEEHEA | 25 | | | | | | | |
| | | | TEGDMA | 2 | | | | | | | |
| | | | TMPTMA | 2 | | | | | | | |
| Comp. Ex. 2 | SBS | 100 | LMA | 6 | none | none | | " | | " | " |
| | | | PPMA | 15 | | | | | | | |
| | | | DEEHEA | 25 | | | | | | | |
| | | | TEGDMA | 2 | | | | | | | |
| | | | TMPTMA | 2 | | | | | | | |

TABLE 1-continued

| | Resin (a) | | Organic compound (b) | | Compound having an alicyclic functional group or an aromatic functional group*2 | Inorganic porous material (c) | | Polymerization initiator (d)*3 | | Other additives*4 | |
|---|---|---|---|---|---|---|---|---|---|---|---|
| | Type | Amount*1 | Type | Amount*1 | | Type | Amount*1 | Type | Amount*1 | Type | Amount*1 |
| Comp. Ex. 3 | (IV) | 100 | LMA<br>PPMA<br>DEEHEA<br>TEGDMA<br>TMPTMA | 6<br>15<br>25<br>2<br>2 | none | C-1504 | 7 | " | " | " | " |
| Ex. 4 | (V) | 100 | BZMA<br>CHMA<br>BDEGMA | 25<br>19<br>6 | 88 | " | 5 | " | " | " | " |
| Ex. 5 | (VI) | 100 | CHMA<br>BDEGMA<br>TMPTMA | 38<br>12<br>3 | 72 | " | 7 | " | " | " | " |
| Ex. 6 | (VII) | 100 | BZMA | 50 | 100 | " | 5 | " | " | " | " |
| Ex. 7 | (VIII) | 100 | PEMA<br>TMPTMA | 47<br>3 | 94 | " | 7 | " | " | " | " |
| Comp. Ex. 4 | (IX) | 100 | PEMA<br>TMPTMA | 47<br>3 | " | " | " | " | " | " | " |
| Ex. 8 | (VI) | 100 | BZMA<br>CHMA<br>BDEGMA | 25<br>19<br>6 | 88 | C-4004 | 5 | " | " | " | " |
| Ex. 9 | (VI) | 100 | BZMA<br>CHMA<br>BDEGMA | 25<br>19<br>6 | " | C-470 | 5 | " | " | " | " |

*1 Amounts of the components of the resin composition are indicated in terms of parts by weight, relative to 100 parts be weight of resin (A).
*2 Among organic compounds (b) used in the Examples and the Comparative Examples, BZMA, CHMA and PEMA are compounds having at least one functional group selected from the group consisting of an alicyclic functional group and an aromatic functional group.
*3 DMPAP represents 2,2-dimethoxy-2-phenylacetophene.
*4 BHT represents 2,6-di-t-butylacetophene and LB represents lauric acid n-butyl ester.

TABLE 2

| Abbreviations used in Table 1 | Nomenclature | Number average molecular weight*1 | Number of polymerizable unsaturated group per molecule*2 |
|---|---|---|---|
| LMA | lauryl methacrylate | 254 | 1 |
| PPMA | propylene glycol monomethacrylate | 400 | 1 |
| DEEHEA | diethylene glycol-2-ethylhexylmethyl acrylate | 286 | 1 |
| TEGDMA | tetraethylene glycol dimethacrylate | 330 | 2 |
| TMPTMA | trimethylol propane trimethacrylate | 339 | 3 |
| BZMA | benzyl methacrylate | 176 | 1 |
| CHMA | cyclohexyl methacrylate | 167 | 1 |
| BDEGMA | buthoxy ethylene glycol methacrylate | 230 | 1 |
| PEMA | phenoxyethyl methacrylate | 206 | 1 |

*1 When organic compound (b) was analyzed by GPC, the chromatogram showed a single peak having a polydispersibility of less than 1.1. Accordingly, the number average molecular weight was determined by mass spectrometric analysis.
*2 Value obtained by NMR.

TABLE 3

| | Relative amount of residual debris (% by weight) | Amount of wiping needed to remove the debris (BEMCOT impregnated with ethanol) | Tack on the relief printing plate after wiping (N/m) | Shape of relief portions corresponding to halftone dots |
|---|---|---|---|---|
| Ex. 1 | 7.8 | ≦3 | 49 | Excellent cone shape |
| Comp. Ex. 1 | 11.0 | 10 | 167 | Excellent cone shape |
| Ex. 2 | 6.0 | ≦3 | 88 | Excellent cone shape |
| Ex. 3 | 8.4 | ≦3 | 83 | Excellent cone shape |
| Comp. Ex. 2 | 16.6 | 30< | 69 | Deformed and unclear dots |
| Comp. Ex. 3 | 8.2 | ≦3 | 118 | Deformed and slightly unclear dots |
| Ex. 4 | 5.1 | ≦3 | 78 | Excellent cone shape |
| Ex. 5 | 3.5 | ≦3 | 93 | Excellent cone shape |
| Ex. 6 | 5.0 | ≦3 | 83 | Excellent cone shape |
| Ex. 7 | 4.3 | ≦3 | 93 | Excellent cone shape |
| Comp. Ex. 4 | 10.0 | ≦3 | 196 | Deformed and unclear dots |
| Ex. 8 | 8.2 | ≦3 | 125 | Excellent cone shape |

TABLE 3-continued

| | Relative amount of residual debris (% by weight) | Amount of wiping needed to remove the debris (BEMCOT impregnated with ethanol) | Tack on the relief printing plate after wiping (N/m) | Shape of relief portions corresponding to halftone dots |
|---|---|---|---|---|
| Ex. 9 | 5.2 | ≦3 | 118 | Excellent cone shape |

TABLE 4

| | Viscosity of the photosensitive resin composition Pa·s (20° C.) |
|---|---|
| Example 1 | 3000 |
| Example 2 | 2830 |
| Example 3 | 700 |
| Example 4 | 2100 |
| Example 5 | 2500 |
| Example 6 | 80 |
| Example 7 | 95 |
| Example 8 | 2000 |
| Example 9 | 2100 |
| Comparative Example 1 | 2340 |
| Comparative Example 2 | —(solid) |
| Comparative Example 3 | 2700 |
| Comparative Example 4 | 9.5 |

EXAMPLE 10

The photosensitive resin composition produced in Comparative Example 2 was shaped into a sheet having a thickness of 2 mm and the shaped resin composition was photocured in the same manner as in Example 1 to obtain an elastomer sheet. The obtained elastomer sheet was used as an elastomer layer (cushion layer) of the below-mentioned multi-layered printing element. The Shore A hardness of the elastomer sheet was 55.

On the above-obtained elastomer sheet was coated the photosensitive resin composition produced in Example 4 (i.e., photosensitive resin composition containing resin (V)) so as to form a coating having a thickness of 0.8 mm. The photosensitive resin coating was photocured in the same manner as in Example 4 to thereby obtain a multi-layered printing element.

A relief pattern was engraved on the obtained multi-layered printing element by means of a carbon dioxide laser engraving apparatus, thereby obtaining a relief printing plate, and the obtained relief printing plate was evaluated. The relative amount of residual debris was 5.7% by weight, the amount of wiping needed to remove the debris was not more than 3 times and the tack on the relief printing plate after wiping was 83 N/m. The portions of the relief pattern, which correspond to halftone dots, had an excellent cone shape.

COMPARATIVE EXAMPLE 5

A printing element was produced in substantially the same manner as in Example 4 except that organic porous spherical particles were used instead of inorganic porous material (c). The organic porous spherical particles were crosslinked polystyrene particles having a number average particle diameter of 8 μm, a specific surface area of 200 m²/g, an average pore diameter of 50 nm and a pore volume of 2.5 ml/g.

When a relief pattern was engraved on the obtained printing element by means of a carbon dioxide laser engraving apparatus, a large amount of viscous liquid debris was generated and the amount of wiping needed to remove the debris became more than 30 times. It is considered that the melting and deformation of the organic porous spherical particles were caused by the laser irradiation and the organic porous spherical particles were incapable of maintaining the porous structure thereof.

COMPARATIVE EXAMPLE 6

A photosensitive resin composition was produced in substantially the same manner as in Example 4 except that 0.2% by weight of carbon black (tradename: Seast SP, SRF-LS; manufactured and sold by Tokai Carbon Co., Ltd., Japan) (average particle diameter: 95 nm, specific surface area: 23 m²/g, average pore diameter: less than 1 nm) was used instead of inorganic porous material (c). The specific porosity of carbon black was 0.8, wherein the specific porosity was calculated using the space between the layers (which was determined by X-ray diffraction analysis) as an average pore diameter and 2.25 g/cm³ as the density.

An attempt was made to produce a printing element from the above-mentioned photosensitive resin composition in the same manner as in Example 4. However, even when the irradiation dose was increased to 6000 mJ/cm², only the surface portion having a thickness of about 0.2 mm could be cured. The resultant semi-cured resin composition could not be used as a laser engravable printing element.

The cured portion of the resin composition (thickness of about 0.2 mm) was separated from the uncured portion of the resin composition, thereby obtaining a resin plate. The surface of the resin plate, on which the uncured liquid resin composition remains, was cured by UV ray irradiation, thereby obtaining a printing element.

A relief pattern was engraved on the obtained printing element by means of a carbon dioxide laser engraving apparatus, wherein the engraving depth was 0.1 mm. The engraving debris formed during the laser engraving was a viscous liquid. It is considered that the addition of carbon black to the resin composition lead to an unsatisfactory curing of the inner portion of the printing element. Such a phenomenon is frequently observed in the case where it is attempted to photocure a photosensitive resin composition to which microparticles having a high ability to absorb UV light have been added. Further, when the amount of carbon black added to the resin composition is small as in the case of Comparative Example 6, the satisfactory removal of the liquid debris by the carbon black cannot be expected.

COMPARATIVE EXAMPLE 7

A printing element was produced in substantially the same manner as in Example 4 except that a substantially nonporous material, namely aluminosilicate (tradename: Silton AMT08L; manufactured and sold by Mizusawa Industrial Chemicals, Ltd.), was used instead of inorganic porous material (c). The nonporous material had a pore volume of 0.08 ml/g, an average pore diameter of 0.9 μm and a specific surface area of 21 m²/g, and exhibited an oil absorption of 60 ml/100 g. The specific porosity (obtained by the above-mentioned method using the density (2 g/cm$^3$) of the material) was 6.3.

When a relief pattern was engraved on the obtained printing element by means of a carbon dioxide laser engraving apparatus, a large amount of viscous liquid debris was generated and the amount of wiping needed to remove the debris became more than 10 times. Although the shape of the portions of the relief pattern which correspond to the halftone dots was a cone, the tack on the relief printing plate after wiping was as high as 280 N/m.

COMPARATIVE EXAMPLE 8

A printing element was produced in substantially the same manner as in Example 4 except that a substantially nonporous material, namely aluminosilicate (tradename: Silton AMT25, manufactured and sold by Mizusawa Industrial Chemicals, Ltd.), was used instead of inorganic porous material (c). The substantially nonporous material had a pore volume of 0.006 ml/g, an average pore diameter of 2.9 μm and a specific surface area of 2.3 m$^2$/g, and exhibited an oil absorption of 40 ml/100 g. The specific porosity (which was obtained by the above-mentioned method using the density (2 g/cm$^3$) of the material) was 2.2.

When a relief pattern was engraved on the obtained printing element by means of a carbon dioxide laser engraving apparatus, a large amount of viscous liquid debris was generated and the amount of wiping needed to remove the debris became more than 10 times. Although the shape of the portions of the relief pattern which correspond to the halftone dots was a cone, the tack on the relief printing plate after wiping was as high as 300 N/m.

COMPARATIVE EXAMPLE 9

A printing element was produced in substantially the same manner as in Example 4 except that a substantially nonporous material, namely sodium calcium aluminosilicate (tradename: Silton JC50, manufactured and sold by Mizusawa Industrial Chemicals, Ltd.), was used instead of inorganic porous material (c). The substantially nonporous material had a pore volume of 0.02 ml/g, an average pore diameter of 5.0 μm and a specific surface area of 6.7 m$^2$/g, and exhibited an oil absorption of 45 ml/100 g. The specific porosity (obtained by the above-mentioned method using the density (2 g/cm$^3$) of the material) was 11.

When a relief pattern was engraved on the obtained printing element by means of a carbon dioxide laser engraving apparatus, a large amount of viscous liquid debris was generated and the amount of wiping needed to remove the debris became more than 10 times. Although the shape of the portions of the relief pattern which correspond to the halftone dots was a cone, the tack on the relief printing plate after wiping was as high as 260 N/m.

INDUSTRIAL APPLICABILITY

By the use of the photosensitive resin composition of the present invention, it becomes possible to produce a printing element which not only has high uniformity in thickness and high dimensional precision, but also generates only a small amount of debris during laser engraving of the printing element. Further, the produced printing element is advantageous in that a precise image can be formed on the printing element by laser engraving and the resultant image-bearing printing plate has small surface tack. Such a printing element can be advantageously used for forming a relief pattern of a flexographic printing plate, a design roll for embossing, a relief pattern for printing tiles and the like, and patterning of a conductive material, a semiconductive material and an insulating material for producing an electronic circuit.

The invention claimed is:

1. A photosensitive resin composition for forming a laser engravable printing element, comprising:
   (a) 100 parts by weight of a resin which is a plastomer at 20° C., wherein said resin has a number average molecular weight of from 1,000 to 100,000 and has a polymerizable unsaturated group in an amount such that the average number of the polymerizable unsaturated group per molecule is at least 0.7,
   (b) 5 to 200 parts by weight, relative to 100 parts by weight of said resin (a), of an organic compound having a number average molecular weight of less than 1,000 and having at least one polymerizable unsaturated group per molecule, and
   (c) 1 to 100 parts by weight, relative to 100 parts by weight of said resin (a), of an inorganic porous material.

2. The photosensitive resin composition according to claim 1, wherein said inorganic porous material (c) has a number average particle diameter of from 0.1 μm to 100 μm, an average pore diameter of from 1 nm to 1,000 nm, and a pore volume of from 0.1 ml/g to 10 ml/g.

3. The photosensitive resin composition according to claim 1 or 2, wherein said resin composition further comprises (d) a photopolymerization initiator.

4. The photosensitive resin composition according to claim 1 or 2, wherein at least 20% by weight of said organic compound (b) is a compound having at least one functional group selected from the group consisting of an alicyclic functional group and an aromatic functional group.

5. The photosensitive resin composition according to claim 1 or 2, wherein said inorganic porous material (c) has a specific surface area of from 10 m$^2$/g to 1,500 m$^2$/g, and exhibits an oil absorption of from 10 ml/100 g to 2,000 ml/100 g.

6. The photosensitive resin composition according to claim 1 or 2 for use in forming a relief printing element.

7. A laser engravable printing element which is a cured photosensitive resin composition having a shape of a sheet or cylinder, wherein said laser engravable printing element contains an inorganic porous material.

8. A multi-layered, laser engravable printing element comprising a printing element layer and at least one elastomer layer provided below the printing element layer, wherein said printing element layer is made of the laser engravable printing element of claim 7 and said elastomer layer has a Shore A hardness of from 20 to 70.

9. The multi-layered, laser engravable printing element according to claim 8, wherein said elastomer layer is produced by photocuring a resin which is in a liquid state at room temperature.

10. A laser engravable printing element obtainable by a process comprising:
   shaping the photosensitive resin composition according to claim 1 or 2 into a sheet or cylinder, and crosslink-curing said photosensitive resin composition by light or electron beam irradiation.

11. A multi-layered, laser engravable printing element comprising a printing element layer and at least one elastomer layer provided below the printing element layer, wherein said printing element layer is made of the laser engravable printing element of claim 10 and said elastomer layer has a Shore A hardness of from 20 to 70.

12. The multi-layered, laser engravable printing element according to claim 11, wherein said elastomer layer is produced by photocuring a resin which is in a liquid state at room temperature.

* * * * *